United States Patent
Mun et al.

(10) Patent No.: US 8,996,792 B2
(45) Date of Patent: Mar. 31, 2015

(54) NON-VOLATILE MEMORY DEVICES, METHODS OF OPERATING NON-VOLATILE MEMORY DEVICES, AND SYSTEMS INCLUDING THE SAME

(75) Inventors: Kui-Yon Mun, Hwaseong-si (KR); Heewon Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 319 days.

(21) Appl. No.: 13/446,155

(22) Filed: Apr. 13, 2012

(65) Prior Publication Data

US 2012/0265928 A1 Oct. 18, 2012

Related U.S. Application Data

(60) Provisional application No. 61/475,695, filed on Apr. 15, 2011.

(30) Foreign Application Priority Data

Aug. 9, 2011 (KR) .......................... 10-2011-0079104

(51) Int. Cl.
| | |
|---|---|
| G06F 12/00 | (2006.01) |
| G11C 16/10 | (2006.01) |
| G11C 16/30 | (2006.01) |
| G11C 16/34 | (2006.01) |

(52) U.S. Cl.
CPC .............. *G11C 16/10* (2013.01); *G11C 16/30* (2013.01); *G11C 16/3418* (2013.01); *G11C 16/349* (2013.01)
USPC .................................. 711/103; 711/E12.008

(58) Field of Classification Search
USPC ......................................................... 711/103
See application file for complete search history.

(56) References Cited

U.S. PATENT DOCUMENTS

| | | | | |
|---|---|---|---|---|
| 6,061,732 | A * | 5/2000 | Korst et al. ................... | 709/231 |
| 2009/0323942 | A1* | 12/2009 | Sharon et al. .................. | 380/44 |
| 2010/0088574 | A1* | 4/2010 | Kim et al. ..................... | 714/763 |
| 2010/0229001 | A1* | 9/2010 | Park et al. ..................... | 713/190 |
| 2010/0229007 | A1* | 9/2010 | Park ............................. | 713/193 |
| 2010/0259983 | A1* | 10/2010 | Yoon ........................ | 365/185.12 |
| 2012/0005409 | A1* | 1/2012 | Yang ............................. | 711/103 |

\* cited by examiner

*Primary Examiner* — Aracelis Ruiz
(74) *Attorney, Agent, or Firm* — Volentine & Whitt, PLLC

(57) ABSTRACT

Random sequence data is sequentially generated based on a seed assigned to a selected memory space, and one of access-requested segments of the selected memory space is logically combined with the sequentially generated random sequence data to transfer the access-requested segment. The sequentially generating and the logically combining are iteratively performed until remaining access-requested segments all transferred.

10 Claims, 36 Drawing Sheets

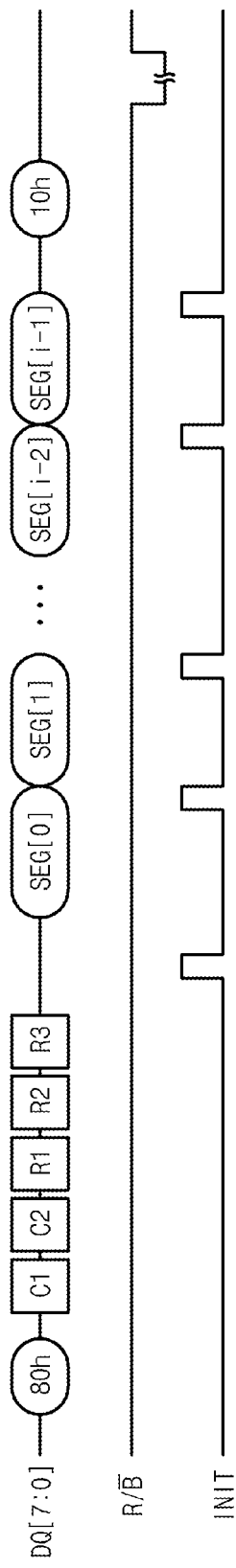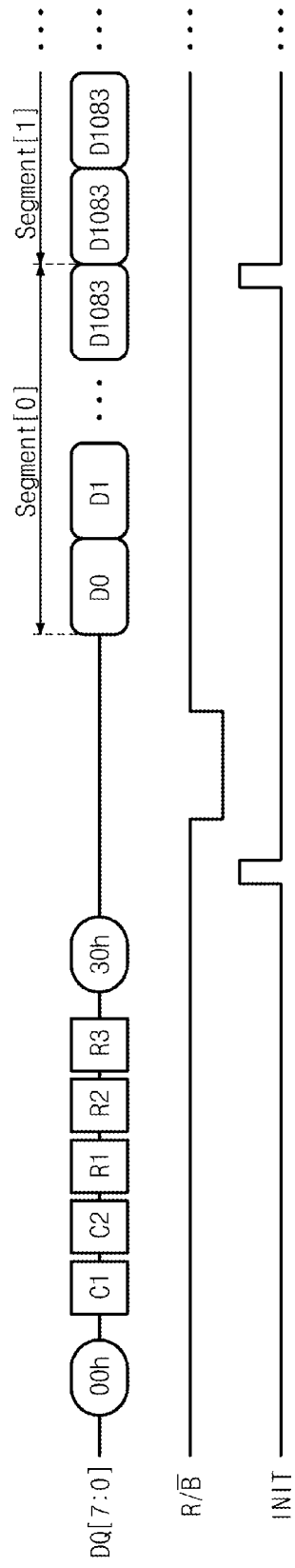

NON-VOLATILE MEMORY DEVICES, METHODS OF OPERATING NON-VOLATILE MEMORY DEVICES, AND SYSTEMS INCLUDING THE SAME

CROSS-REFERENCE TO RELATED APPLICATIONS

A claim of priority under 35 U.S.C §119 is made to U.S. Provisional Application No. 61/475,695, filed Apr. 15, 2011, and to Korean Patent Application No. 10-2011-0079104, filed Aug. 9, 2011, the entireties of which are incorporated by reference herein.

BACKGROUND

Exemplary embodiments relate to semiconductor memory devices, and in particular, example embodiments relate to non-volatile memory devices and to systems including non-volatile memory devices.

Non-volatile memory devices retain stored data in the absence of supplied power. Examples of non-volatile memory devices include flash memory (e.g., NAND flash and NOR flash memories), Phase change Random Access Memory (PRAM), a Magnetroresistive Random Access Memory (MRAM), a Ferroelectric Random Access Memory (FRAM), a Resistance Random Access Memory (RRAM), a Spin transfer Torque Random Access Memory (STT-RAM), and so on.

Among these, the flash memory device is a type of EEPROM (Electrically Programmable Erasable Read Only Memory) in which a plurality of memory regions are erased or programmed by one program operation. This is in contrast to a conventional EEPROM which enables only one memory region to be erased or programmed at a time. As such, systems adopting a flash memory device can operative at relatively high speeds by executing read and write operations on different memory regions simultaneously.

As mentioned above, flash memory devices are non-volatile in that they retained stored data in the absence of supplied power. That is, a flash memory device fabricated on a silicon chip retains stored information even when the supply of power to the chip is interrupted. This results in an effective means to reduce power consumption. In addition, a flash memory device exhibits a relatively high resistance to physical impact. These characteristics, together with high speed access times and the like, have resulted in the flash memory device being commonly utilized for data storage in battery-powered and portable appliances.

SUMMARY

According to one aspect of embodiments of the inventive concept, a method of randomizing and de-randomizing data transferred to/from a selected page of a nonvolatile memory device is provided. The method includes sequentially generating random sequence data based on a seed assigned to the selected page, the selected page including a plurality of segments, and logically combining one of access-requested segments among the plurality of segments of the selected page and the sequentially generated random sequence data. The method further includes iteratively applying the seed assigned to the selected page to remaining access-requested segments among the plurality of segments of the selected page by iteratively performing the sequentially generating and the logically combining until the remaining access-requested segments all transferred.

According to another aspect of embodiments of the inventive concept, a nonvolatile memory device is provided which includes a page buffer circuit configured to read or write data from or to a selected page of a memory cell array, and a randomization and de-randomization circuit configured to randomize and de-randomize data being transferred to or from the page buffer circuit based on a seed assigned to the selected page. The selected page includes a plurality of segments, and the randomization and de-randomization circuit is further configured to generate a random sequence for each of access-requested segments among the plurality of segments of the selected page based on the seed assigned to the selected page and to randomize and de-randomize data of each access-requested segment based on the random sequence which is iteratively generated according to the seed.

According to still another aspect of embodiments of the inventive concept, a nonvolatile memory device is provided which includes a memory cell array, a random sequence data generator configured to generate random sequence data sequentially, and a first multiplexer configured to receive program data to be stored in the memory cell array and inverted data of the program data, and to select the program data or the inverted data in response to the random sequence data as a selection signal, the data selected by the first multiplexer being stored in the memory cell array as randomized data.

According to another aspect of embodiments of the inventive concepts, a nonvolatile memory device includes a memory cell array, a register configured to store a parameter value input according to a set feature command, a random sequence data generator configured to sequentially generate random sequence data, a selection signal generator configured to generate a selection signal in response to the parameter value stored in the register and the random sequence data, and a first multiplexer configured to receive program data to be stored in the memory cell array and inverted data of the program data, and to select the program data or the inverted data in response to the selection signal.

According to yet another aspect of embodiments of the inventive concept, a memory card is provided which includes a nonvolatile memory device including a plurality of pages, and a controller including a buffer and configured to control the nonvolatile memory device. The controller further includes a randomization and de-randomization circuit configured to randomize and de-randomize data being transferred to and from the nonvolatile memory device based on a seed assigned to a selected page, the selected page including a plurality of segments. The randomization and de-randomization circuit includes a seed table configured to store seeds corresponding to the pages, respectively, a pseudo-random sequence generator configured to generate a random sequence based on a seed provided from the seed table and corresponding to the selected page, a mixer configured to logically combine the random sequence and data of an access-requested segment among the segments of the selected page, and a seed initialization part configured to initialize the pseudo-random sequence generator with the seed corresponding to the selected page so as to randomize and de-randomize data of each of access-requested segments among the segments of the selected page according to the random sequence iteratively generated according to the seed corresponding to the selected page.

According to another aspect of embodiments of the inventive concept, a solid state drive is provided which includes a storage medium including a plurality of memory spaces, a plurality of channels, and a controller connected to the storage medium via the plurality of channels and configured to control the storage medium. The controller randomizes and de-randomizes data being transferred to and from the storage medium by sequentially generating random sequence data based on a seed assigned to a selected space among the plurality of memory spaces, logically combining one of access-requested segments of the selected space and the sequentially generated random sequence data, and iteratively applying the seed assigned to the selected space to the remaining access-requested segments of the selected space by iteratively performing the sequentially generating and the logically combining until remaining access-requested segments of the selected space are all transferred.

BRIEF DESCRIPTION OF THE DRAWINGS

The above and other objects and features will become apparent from the detailed description that follows with reference to the accompanying drawings, wherein like reference numerals refer to like parts unless otherwise specified.

FIGS. 7A and 7B are timing diagrams for describing read and write operations of a non-volatile memory device according to an exemplary embodiment of the inventive concept.

DETAILED DESCRIPTION

Figure 1:
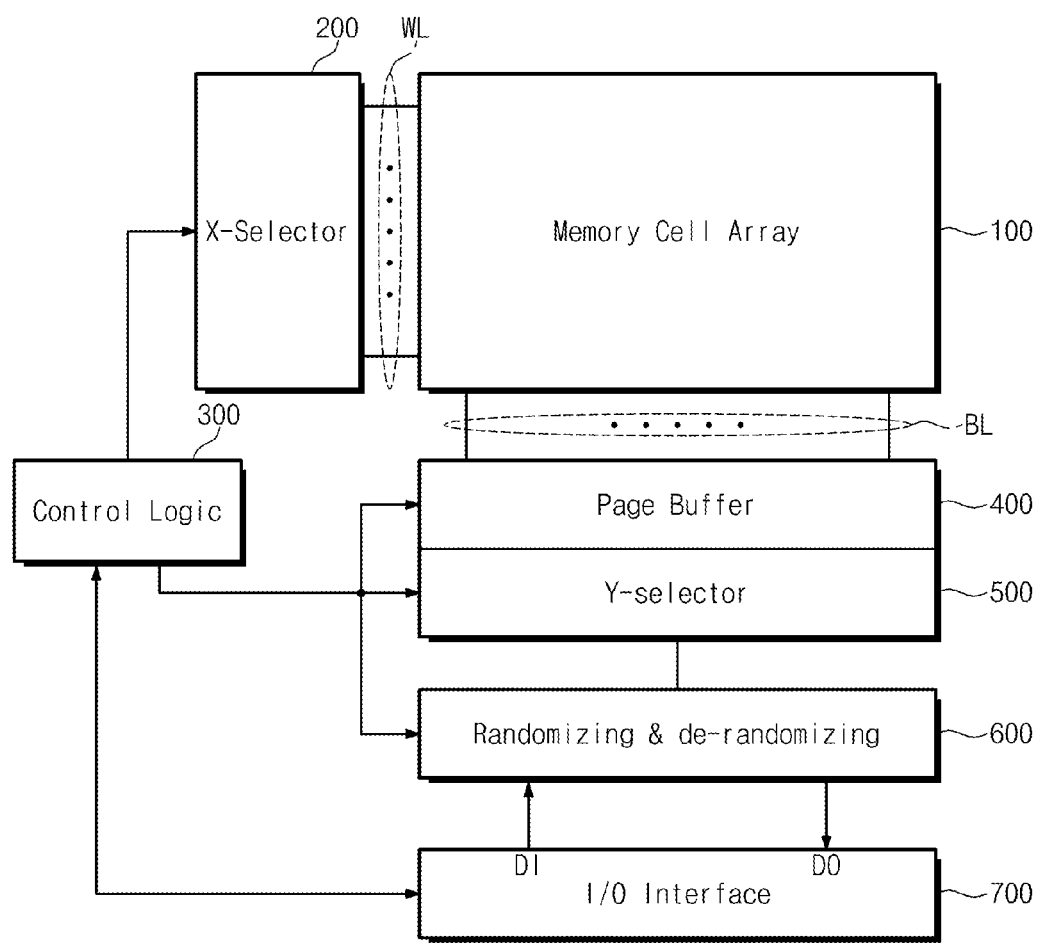
FIG. 1 is a block diagram showing a non-volatile memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram showing a non-volatile memory device according to an exemplary embodiment of the inventive concept.

In the description that follows, the non-volatile memory device of FIG. 1 is described as a flash memory device, and in particular, as a NAND flash memory device. However, it is understood that the inventive concept is not limited to a flash memory device. For example, the inventive concept may be applied to other types of non-volatile memory devices, such as a Phase change Random Access Memory (PRAM), a Magnetoresistive Random Access Memory (MRAM), a Ferroelectric Random Access Memory (FRAM), a Resistance Random Access Memory (RRAM), a Spin transfer Torque Random Access Memory (STT-RAM), and the like.

The flash memory device of the example of FIG. 1 includes a memory cell array 100, a row (X) selector 200, control logic 300, a page buffer 400, a column (Y) selector 500, a randomizing & de-randomizing unit 600 and an input/output (I/O) interface 700.

The memory cell array 100 includes memory cells arranged in rows (or, word lines) WL and columns (or, bit lines) BL. As mention above, in the example of this embodiment, the memory cells are NAND flash memory cells. Each memory cell stores 1-bit data or M-bit (or, multi-bit) data (M being an integer of 2 or more). In the case where each memory cell stores 1-bit data, memory cells in each row of the memory cell array 100 may constitute a memory space which corresponds, for example, to a memory page. In the case where each memory cell stores M-bit data, memory cells in each row of the memory cell array 100 may constitute multiple memory spaces corresponding to multiple memory pages. Each memory cell may be implemented by a memory cell having a charge storing layer such as a floating gate or a charge trap layer or a memory cell having a variable resistance element. The memory cell array 100 may be implemented to have a single-layer array structure (or, a two-dimensional array structure) or a multi-layer array structure (or, a vertical or stack-type three-dimensional array structure).

A row selector circuit 200 is controlled by the control logic 300 and is configured to perform selecting and driving operations on rows of the memory cell array 100.

The control logic 300 is configured to control an overall operation of the flash memory device.

The page buffer 400 is controlled by the control logic 300 and operates as a sense amplifier and a write driver depending upon to a mode of operation. For example, during a read operation, the page buffer 400 operates as a sense amplifier which senses data from memory cells of a selected row. During a program operation, the page buffer 400 operates as a write driver which drives memory cells of a selected row according to program data. The page buffer circuit 400 may include multiple page buffer circuits corresponding to bit lines or bit line pairs, respectively. In the case where respective memory cells store multi-bit data, each page buffer of the page buffer circuit 400 may be configured to have two or more latches.

The column selector circuit 500 is controlled by the control logic 300 and sequentially selects columns of the memory cell array 100 (or, page buffer circuits of the page buffer 400) during reading/programming operations.

The randomizing and de-randomizing circuit 600 is controlled by the control logic 300 and is configured to randomize data (input data D1) transferred via the input/output interface 700, that is, data to be programmed or original data. The randomizing and de-randomizing circuit 600 is configured to de-randomize data (i.e., randomized data) of the page buffer 400 transferred via the column selector circuit 500 to obtain output data D0. The randomizing and de-randomizing circuit 600 according to an exemplary embodiment of the inventive concept is configured to perform randomizing and de-randomizing operations on full-page data or random data being less in amount than full-page data. The random data may include data of a spare region, sector data, data which is more than sector data and less than page data, and the like, for example. This will be more fully described below.

A memory cell has any one of 2N threshold voltage distributions (N indicating the number of data bits stored in a memory cell) according to the amount of charges stored in a charge storing element. A threshold voltage (or, a threshold voltage distribution) of a memory cell may vary due to coupling (called word line coupling) generated between adjacent memory cells. By data randomization of the inventive concept, it is possible to reduce variations of threshold voltages of memory cells caused by word line coupling. This is because the threshold states of the memory cells are distributed more uniformly, and thus a level of word line coupling generated between memory cells may be reduced as compared with the case in which non-randomized data is stored. That is, variations in threshold voltages of memory cells may be suppressed, which in turn can enhance read margins.

In some embodiments, the randomizing and de-randomizing operations may be performed selectively. For example, when an access to specific data or a specific region is requested, the randomizing and de-randomizing circuit 600 is configured to perform its randomizing and de-randomizing operations. The randomizing and de-randomizing circuit 600 is configured such that data input via the input/output interface 700 is transferred to the page buffer 400 without a randomizing operation of the randomizing and de-randomizing circuit 600. Afterwards, randomizing on data loaded on the page buffer circuit 400 may be made via the randomizing and de-randomizing circuit 600 under the control of the control logic 300.

Figure 2A:
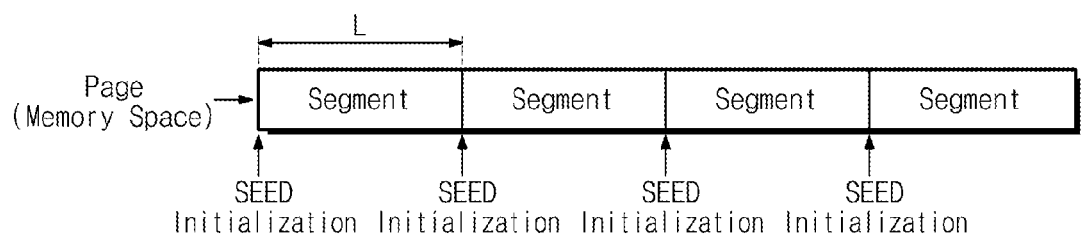
FIG. 2A is a diagram for describing a randomization unit of a non-volatile memory according to an exemplary embodiment of the inventive concept.
Figure 2B:
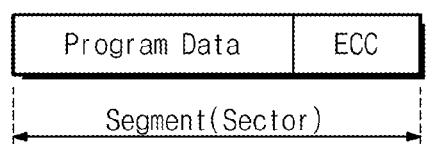
FIG. 2B is a diagram showing an embodiment of a segment illustrated in FIG. 2A.

FIG. 2A is a diagram for describing a randomization operation of a flash memory according to an exemplary embodiment of the inventive concept, and FIG. 2B is a diagram showing an embodiment of a segment illustrated in FIG. 2A.

A flash memory device includes a plurality of memory spaces. For ease of explanation, only one memory space is illustrated in FIG. 2A. A memory space may correspond to one page, for example. The memory space, that is, page is formed of segments each having a size (called a length) L which is defined by a user. A segment size L may be determined by sizes of program data and ECC data, for example. A segment includes program data to be programmed in a memory space of the flash memory device, and ECC parity generated according to the program data, as illustrated in FIG. 2B. In other words, program data and ECC parity are included within one segment. The segment size L may be determined according to a size of the program data, for example. Random read and write operations on the flash memory device are performed on the basis of program data (or, a segment). A size of the program data can be variously established according to a definition of a user. Further, a size of the ECC parity can be variously establish according to a definition of a user. Accordingly, the segment size L may be changed according to applications of the flash memory device. That is, the segment size L can be varied according to a user's definition.

According to an exemplary embodiment of the inventive concept, one seed is assigned to one page for randomizing/de-randomizing. Further, data randomization is made on the basis of a segment, not a page. In this case, a seed assigned to one page may be iteratively applied to each segment regardless of a random access and a sequential access. In other word, as illustrated in FIG. 2A, seed initialization is performed per segment. By the seed initialization, data in each segment is randomized/de-randomized according to a random sequence which is generated according to a seed assigned to a corresponding page. That is, a seed assigned to a page is iteratively applied to each segment. Later herein, a technique will be fully described in which a seed assigned to one page is iteratively applied to each segment.

In an exemplary embodiment, the term "sector" can be used instead of the term "segment" having a size decided according to a user's definition. However, the inventive concept is not limited by terminology, it is well understood that various terms may be used do described data having a size establish according to a user's definition. Further, the term "segment" may be used to indicate a unit of data formed of program data and ECC.

Figure 3:
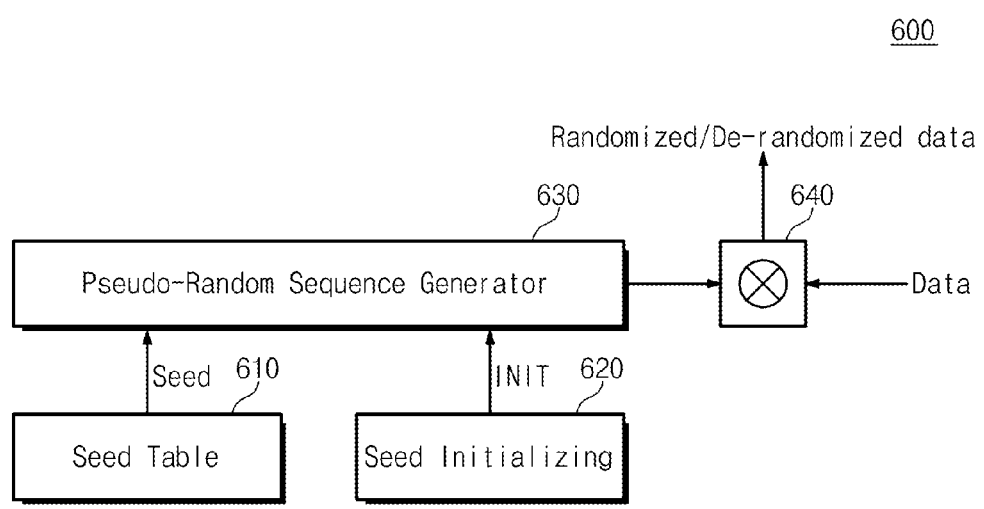
FIG. 3 is a block diagram of a randomizing and de-randomizing circuit in FIG. 1 according to an exemplary embodiment of the inventive concept.

FIG. 3 is a block diagram of a randomizing and de-randomizing circuit shown in FIG. 1 according to an exemplary embodiment of the inventive concept.

Referring to FIG. 3, a randomizing and de-randomizing circuit 600 includes a seed table 610, a seed initializing part 620, a pseudo-random sequence generator 630, and a mixer 640. The seed table 610 is configured to store seeds each assigned to rows (or, pages). Seeds of the seed table 610 are selected by an address (e.g., a page address) of an access-requested page (or, row), and a selected seed is loaded onto the pseudo-random sequence generator 630. An operation of loading a selected seed onto the pseudo-random sequence generator 630 is referred to as a seed initialization operation. The pseudo-random sequence generator 630 is initialized by a selected seed of the seed table 610 via the seed initialization operation. The seed initializing part 620 generates an initialization signal INIT for initializing the pseudo-random sequence generator 630 with a selected seed. The initialization signal INIT may be generated upon an access request or prior to randomizing/de-randomizing of each segment. An operation of generating the initialization signal INIT will be more fully described below. The initialization signal INIT may be generated as a signal pulse (i.e., in a pulse shape), for example. The pseudo-random sequence generator 630 is initialized by a seed provided from the seed table 610 in response to the initialization signal INIT, and sequentially generates random sequence data RSD following the seed initialization operation. The random sequence data RSD is provided to the mixer 640. A group of random sequence data RSD sequentially provided to the mixer 640 may form a random sequence. Herein, the random sequence data RSD may be 1-bit data. However, it is well understood that a bit number of the random sequence data RSD is not limited thereto. For example, random sequence data RSD having multi-states can be used. At this time, a value indicating a multi-state is defined by one symbol, and an original symbol value is logically combined with random sequence symbol data. Accordingly, an overall random characteristic among symbol values is improved.

The mixer 640 logically combines the random sequence data RSD and transfer data (or, the random sequence data RSD and data input to the mixer 640) and outputs combined data as randomized/de-randomized data. For example, at a read operation, the mixer 640 logically combines randomized data provided via a column selector circuit 500 in FIG. 1 and the random sequence data RSD, and outputs combined data to an input/output interface 700 as de-randomized data. At a write operation, the mixer 640 logically combines data provided via the input/output interface 700 and the random sequence data RSD, and outputs combined data to the column selector circuit 500 as randomized data. In the event that data of a byte unit is provided to the mixer 640, a random sequence data bit may be logically combined with each of data bits read or each of data bits to be programmed.

In an exemplary embodiment, the mixer 640 is formed of XOR logic. However, the configuration of the mixer 640 is not limited thereto.

Figure 4:
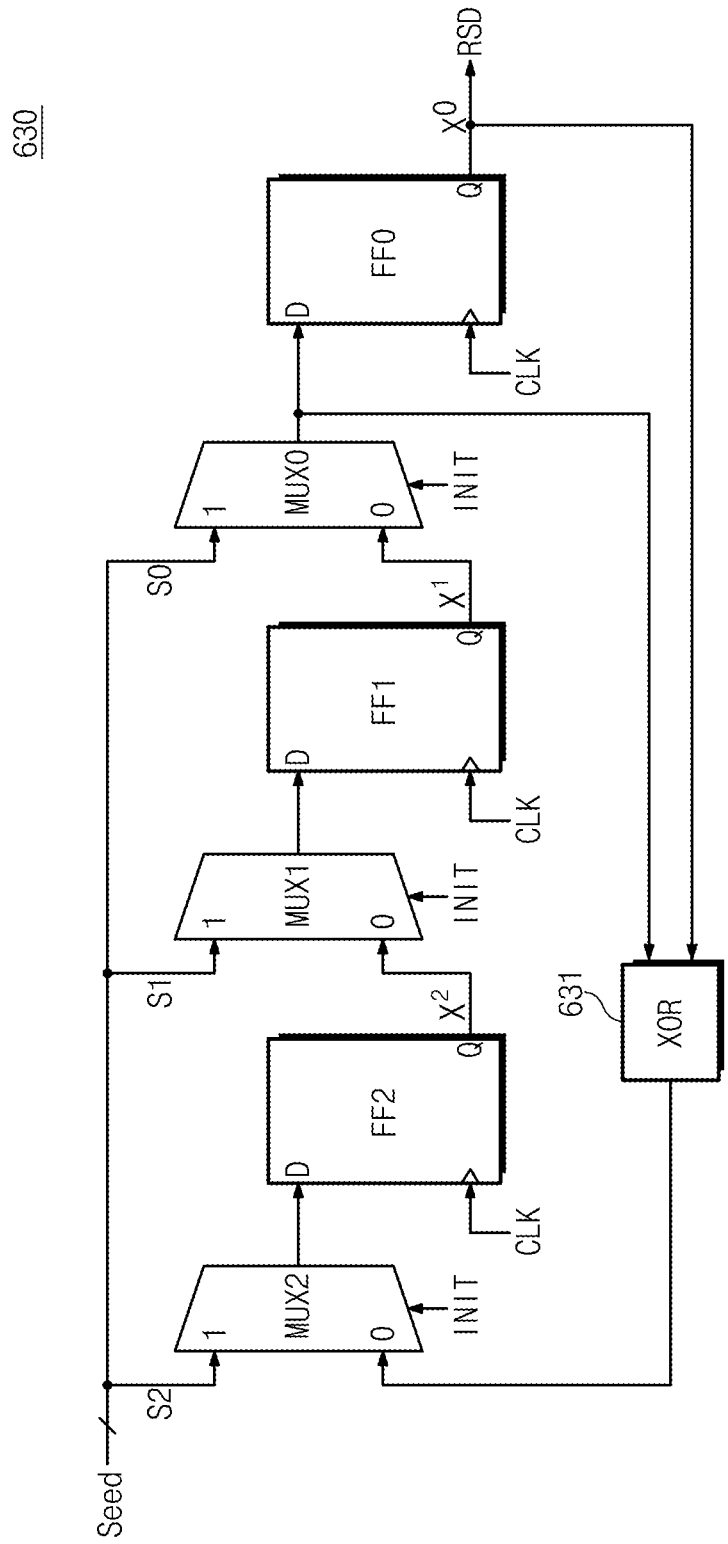
FIG. 4 is a block diagram of a pseudo-random sequence generator in FIG. 3 according to an exemplary embodiment of the inventive concept.

FIG. 4 is a block diagram showing an example of the pseudo-random sequence generator 630 shown in FIG. 3 according to an exemplary embodiment of the inventive concept.

Referring to FIG. 4, the pseudo-random sequence generator 630 includes flip-flops FF0, FF1, and FF2 constituting a shift register, multiplexers MUX0, MUX1, and MUX2, and an XOR logic gate 631, which are connected as illustrated in FIG. 4. The pseudo-random sequence generator 630 is implemented by a Linear Feedback Shift Register (LFSR) which includes one shift register and an XOR logic gate 631. It is noted, however, that the configuration of the pseudo-random sequence generator 630 is not limited to the example of FIG. 4. As other examples, the pseudo-random sequence generator 630 can be implemented by a Pseudo-random Number (PN) sequence generator, a Cyclic Redundancy Code (CRC) generator, and the like.

When an initialization signal INIT is activated (e.g., as a signal pulse), a seed (S2S1S0) provided from a seed table 610 in FIG. 3 may be transferred to the flip-flops FF2, FF1, and FF0 via the multiplexers MUX2, MUX1, and MUX0. For example, a seed value S2 is loaded on the flip-flop FF2 via the multiplexer MUX2, a seed value S1 is loaded on the flip-flop FF1 via the multiplexer MUX1, and a seed value S0 is loaded on the flip-flop FF0 via the multiplexer MUX0. That is, whenever the initialization signal INIT is activated, a seed initialization operation is performed such that the pseudo-random sequence generator 630 is set to a selected seed of the seed table 610. After the seed initialization operation, the pseudo-random sequence generator 630 generates random sequence data RSD sequentially in response to a clock signal CLK. Herein, the clock signal CLK may be generated in synchronization with a signal (e.g., a read enable signal /RE or a write enable signal /WE) toggled at data input/output.

Figure 5A:
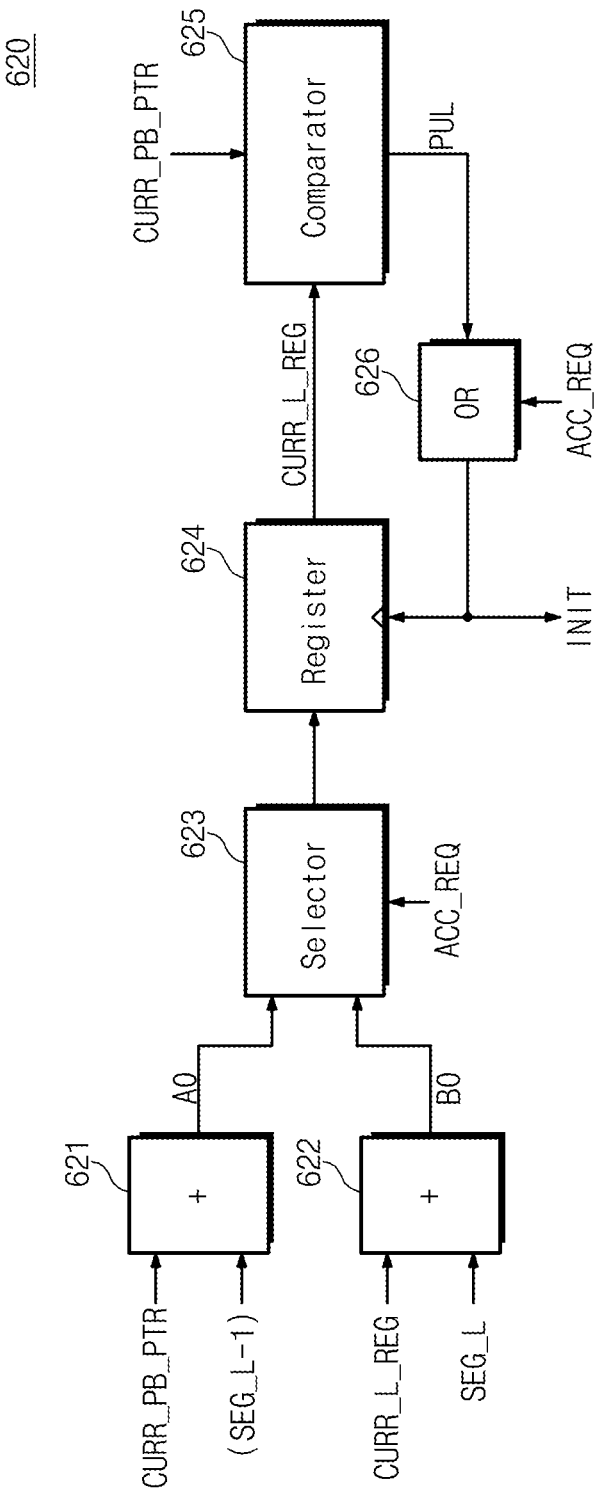
FIG. 5A is a block diagram of a seed initializing part in FIG. 3 according to an exemplary embodiment of the inventive concept.

FIG. 5A is a block diagram showing an example of seed initializing part 620 illustrated in FIG. 3 according to an exemplary embodiment of the inventive concept.

Referring to FIG. 5A, the seed initializing part 620 includes first and second adders 621 and 622, a selector 623, a register 624, a comparator 625, and an OR gate 626. The seed initializing part 620 generates an initialization signal INIT at an access request. Further, the seed initialization part 620 generates the initialization signal INIT before randomizing/de-randomizing on data of a current segment is ended. By generation of the initialization signal INIT, a seed of a seed table 610 corresponding to an accessed page is loaded on the pseudo-random sequence generator 630. That is, the pseudo-random sequence generator 630 is initialized by a seed of the seed table 610 corresponding to an accessed page. Initializing of the pseudo-random sequence generator 630 may be made whenever the initialization signal INIT is generated.

The first adder 621 adds inputs CURR_PB_PTR and SEG_L-1, and the second adder 622 adds inputs CURR_L_REG and SEG_L. Herein, the input CURR_PB_PTR indicates a pointer for appointing a page buffer selected by a column selector circuit 300 in FIG. 1. That is, the input CURR_PB_PTR indicates a current column address value. The input SEG_L indicates a segment size defined by a user, and the input CURR_L_REG indicates an output of the register 624.

The selector 623 selects one of the first and second adders 621 and 622 in response to a selection signal ACC_REQ. The selection signal ACC_REQ is activated (e.g., as a signal pulse) at an access request. The selector 623 selects an output AO of the first adder 621 at activation of the selection signal ACC_REQ, and selects an output BO of the second adder 622 at inactivation of the selection signal ACC_REQ. The register 624 is used to store a value selected by the selector 623 in response to an initialization signal INIT from the OR gate 626. The comparator 625 judges whether an output CURR_L_REG of the register 624 is coincident with a current column address CURR_PB_PTR, and generates a pulse signal PUL as the judgment. The OR gate 626 generates the initialization signal INIT in response to the selection signal ACC_REQ and the pulse signal PUL. When any one of the selection signal ACC_REQ and the pulse signal PUL is activated, the initialization signal INIT is activated (e.g., as a signal pulse). When the initialization signal INIT is activated, a seed initialization operation on the pseudo-random sequence generator 630 is made, and simultaneously, a value indicating last data of a next segment is loaded onto the register 624.

The seed initializing part 620 according to an exemplary embodiment of the inventive concept is not limited to the example of FIG. 5A. For example, although not shown in figures, one of the first and second adders 621 and 622 can be removed. In this case, the selector 623 is placed at a previous stage of the adder, and transfers inputs CURR_PB_PTR and SEG_L-1 or inputs CURR_L_REG and SEG_L to the adder. A value added by the adder is sent to the register 624.

Figure 5B:
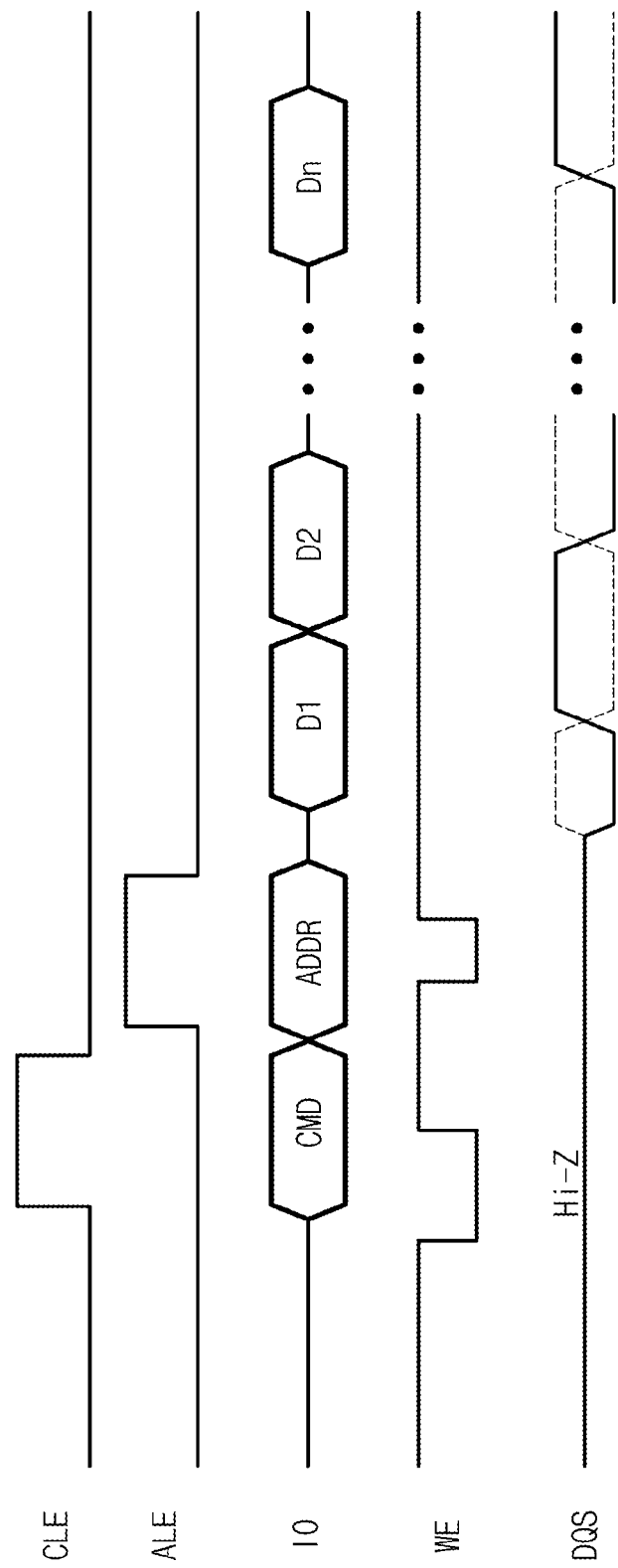
FIGS. 5B and 5C are timing diagrams for describing a segment size setting method according to an exemplary embodiment of the inventive concept.
Figure 5C:
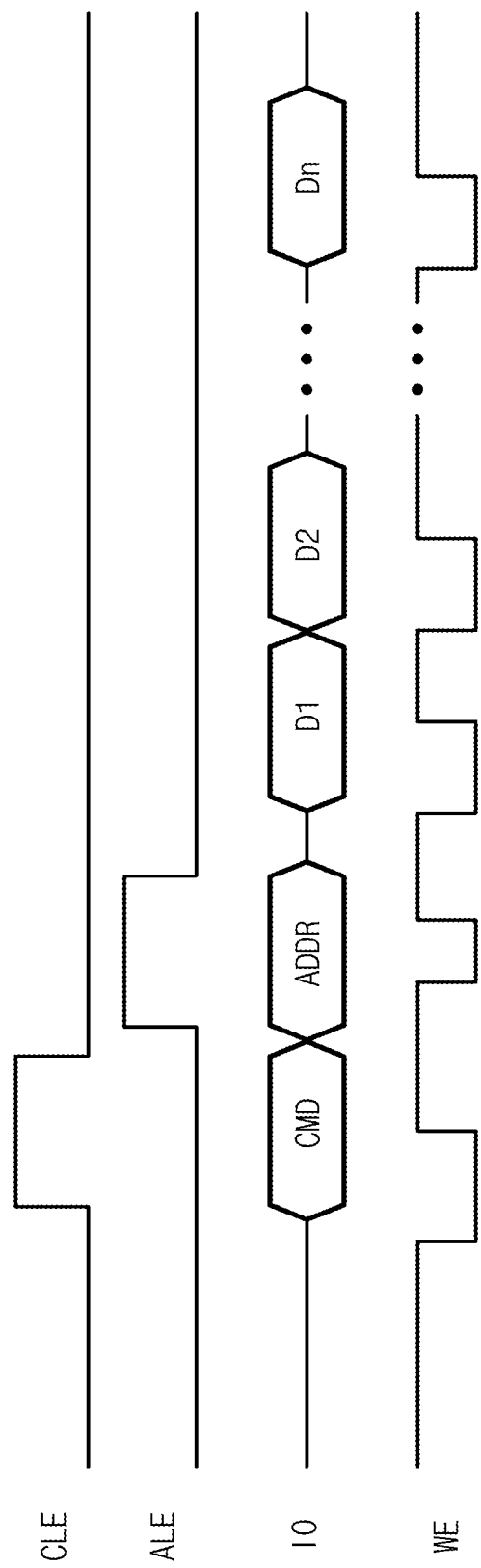

FIGS. 5B and 5C are timing diagrams for describing a segment size setting method according to an exemplary embodiment of the inventive concept. In these figures, CLE denotes a clock enable signal, ALE denotes an address latch enable signal, IO denotes input/output, WE denotes a write enable signal, and DQS denotes a data strobe signal (which transitions from Hi-Z to toggle between logic low and logic high).

A segment size SEG_L may be provided from a memory controller, to which a flash memory device is applied, using a specific command. For example, as illustrated in FIG. 5B, a parameter indicating the segment size SEG_L is sent to a flash memory device from the memory controller together with a set feature command (CMD). Herein, an address (ADDR) is used to indicate a position (e.g., a register position) where data D0 to Dn indicating the segment size SEG_L is to be stored. The data D0 to Dn indicating the segment size SEG_L may be stored in a register of the flash memory device (e.g., control logic 300 in FIG. 1) in synchronization with rising and falling edges of a write enable signal WE, respectively. As illustrated in FIG. 5C, it is well understood that the data D0 to Dn indicating the segment size SEG_L is received in a single data rate (SDR) manner instead of a double data rate (DDR) manner in FIG. 5B. An operation of setting the segment size SEG_L may be accomplished by sending a value of the segment size SEG_L to the flash memory device with the set feature command after power-up.

In an exemplary embodiment of the inventive concept, as illustrated in FIG. 5B, a command and an address is transferred according to toggling of a WE signal, and at a write operation, data is received from an external device according to toggling of a DQS signal as a data strobe signal. Likewise, at a read operation, data is output to the external device according to toggling of a DQS signal which is generated according to a signal RE (not shown) provided from the external device. A flash memory device adopting this data input/output protocol is referred to as a "toggle DDR NAND flash memory device". The toggle DDR NAND flash memory device is disclosed in a document available on the World Wide Web at uniform resource locator (URL) "http://www.samsung.com/global/busines s/semiconductor/products/flash/Products_Toggle_DDR_NANDFlash.html", the entirety of which is incorporated by reference herein. Further, the flash memory device can be formed of an ONFI (Open NAND Flash Interface) DDR NAND flash memory device. The ONFI DDR NAND flash memory device is disclosed on the World Wide Web at uniform resource locator (URL) "http://onfi.org/specifications/", the entirety of which is incorporated by reference herein. Meanwhile, as illustrated in FIG. 5C, in the case of a read/write operation based on the SDR manner, a WE signal (and/or a RE signal) can be used instead of a DQS signal.

In an exemplary embodiment, a part of data provided with a set feature command is used as data indicating the segment size SEG_L. The remaining data is used to appoint a parameter different from the segment size. This will be more fully described below. Instead of the set feature command, a test command can be used to set the segment size SEG_L.

An operation of setting the segment size SEG_L is not limited to the examples presented above. For example, a value of the segment size SEG_L may be stored in a memory cell array 100 of a flash memory device as non-volatile trim information. In this case, at power-up, a value of the segment size SEG_L is loaded onto the randomizing and de-randomizing circuit 600 under the control of control logic 300. As another example, a value of the segment size SEG_L can be set by fuse circuitry at a wafer or package level during fabrication.

Figure 6A:
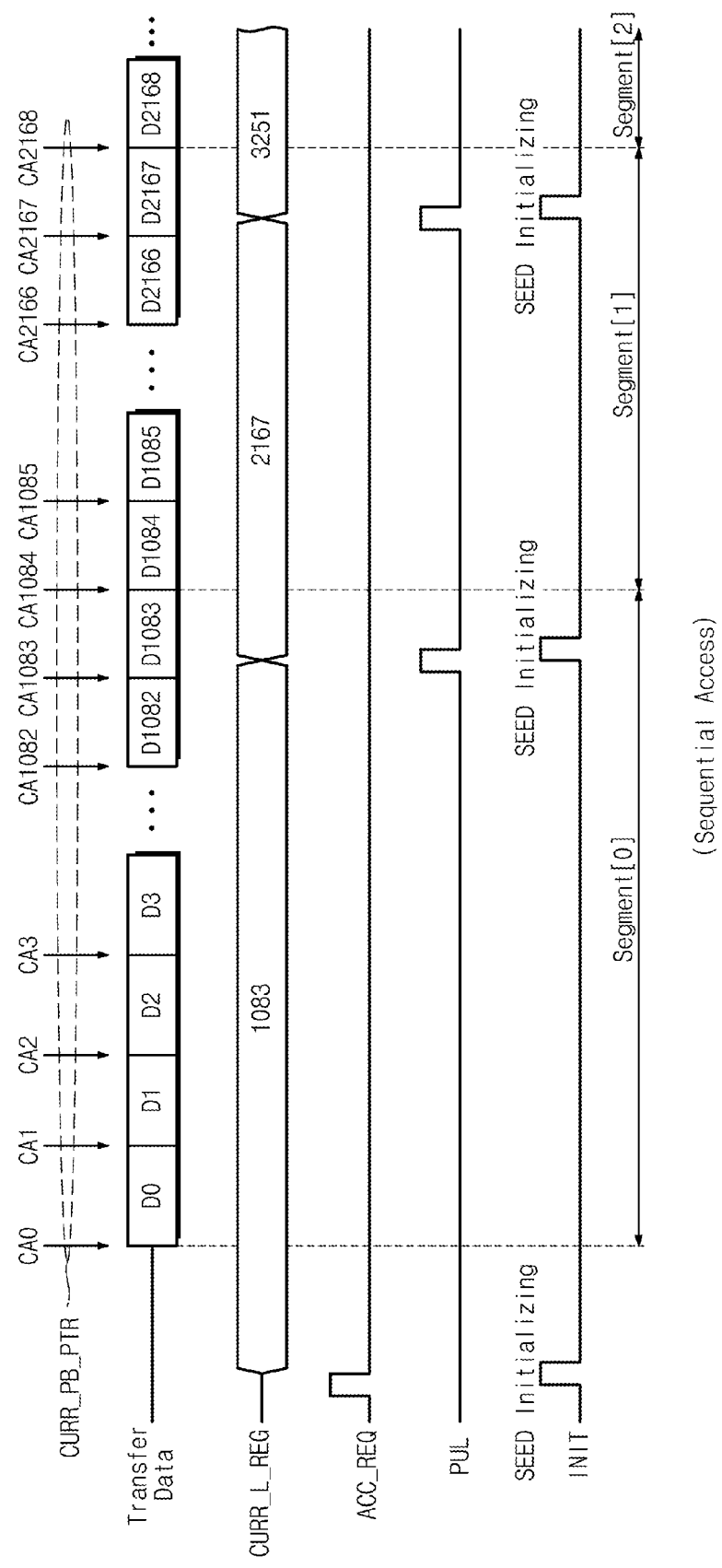
FIGS. 6A and 6B are timing diagrams for describing an operation of a randomizing and de-randomizing circuit according to an exemplary embodiment of the inventive concept.

FIG. 6A is a timing diagram for describing an operation of a randomizing and de-randomizing circuit according to an exemplary embodiment of the inventive concept. Below, an operation of a randomizing and de-randomizing circuit according to an exemplary embodiment of the inventive concept will be more fully described with reference to accompanying drawings. As examples only, it is assumed that a segment size L is 1084 B (B indicating a byte). Further, it is assumed that a column address input at an access request is CA0. With the assumptions, a requested access may be a sequential access for reading full-page data.

First of all, when a read/write operation is requested, an address corresponding to an access-requested page is sent to a flash memory device. One of seeds of a seed table 610 is selected according to the page address. The selected seed is sent to a pseudo-random sequence generator 630. An access request is completed after a specific command (e.g., 30h) is received at a read operation and after an address is received at a write operation. Upon completion of an access request, a selection signal ACC_REQ is activated as a signal pulse by control logic 300.

As the selection signal ACC_REQ is activated, an OR gate 626 of a seed initializing part 620 activates an initialization signal INIT as a signal pulse in response to the activated selection signal ACC_REQ. As the initialization signal INIT is activated as a signal pulse, the pseudo-random sequence generator 630 is initialized by a seed provided from the seed table 610. In other words, when the initialization signal INIT is activated, a seed S0-S2 is sent to flip-flops FF0 to FF2 via multiplexers MUX0 to MUX2 of the pseudo-random sequence generator 630. As a result, when the initialization signal INIT is activated, a seed initialization operation is performed such that the pseudo-random sequence generator 630 is initialized by a seed provided from the seed table 610.

As the selection signal ACC_REQ is activated, a selector 623 of the seed initializing part 620 transfers an output AO of a first adder 621 to a register 624. The output AO of the first adder 624 is stored in the register 624 according to activation of the initialization signal INIT. The output AO of the first adder 621 has a value of 1083, that is, a sum of a value, indicating a current column address CA0, and a value (SEG_L−1) less by 1 than a segment size. That is, the register 624 is set to a value of 1083. This means that an output CURR_L_REG of the register 624 has a value of 1083. A value stored in the register 624 is used to indicate last data of a currently transferred segment (or, called last segment data) (e.g., D1083). This is to perform a seed initialization operation for randomizing/de-randomizing of first segment data (e.g., D1084) of a next segment.

Following the seed initialization operation, data (e.g., randomized data as read data or data to be programmed) is sent to the randomizing and de-randomizing circuit 600. A mixer 640 logically combines data sent to the randomizing and de-randomizing circuit 600 and random sequence data RSD from a pseudo-random sequence generator 630. That is, data sent to the randomizing and de-randomizing circuit 600 is randomized or de-randomized. As data is sequentially sent to the randomizing and de-randomizing circuit 600, as illustrated in FIG. 6A, a column address CA also increases sequentially. A value CURR_PB_PTR indicating a current column address CA is transferred to a comparator 625 of the seed initializing part 630. The comparator 625 judges whether the output CURR_L_REG (indicating last segment data of a current segment) of the register 624 is coincident with a value CURR_PB_PTR indicating a current column address.

If the output CURR_L_REG of the register 624 is coincident with a value CURR_PB_PTR indicating a current column address, an output PUL of the comparator 625 is activated as a signal pulse. In other words, as illustrated in FIG. 6A, when the output CURR_L_REG of the register 624 is 1083 and a value CURR_PB_PTR indicating a current column address is 1083, the output PUL of the comparator 625 is activated as a signal pulse. That the output of the comparator 625 is activated means that random sequence data RSD for last segment data of a current segment is generated. As the output PUL of the comparator 625 is activated in a pulse shape, the initialization signal INIT is also activated as a signal pulse. This means that a seed (corresponding to an access-requested page) output from the seed table 610 is loaded onto the flip-flops FF2 to FF0 via the multiplexers MUX2 to MUX0 of the pseudo-random sequence generator 630. That is, a seed initialization operation of the pseudo-random sequence generator 630 is performed.

At this time, since the selection signal ACC_REQ is maintained at an inactive state, an output BO of a second adder 622 is sent to the register 624 via the selector 623. When the initialization signal INIT is activated as a signal pulse according to activation of the output PUL of the comparator 625, the output BO of the second adder 622 is loaded onto the register 624. Herein, the output BO of the second adder 622 has a value of 2167, that is, a sum of a segment size SEG_L and an output CURR_L_REG of the register 624. That is, the register 624 is set to a value of 2167 indicating last segment data D2167 of a second segment. This means that an output of the register 624 has a value of 2167.

Afterwards, a data randomizing/de-randomizing operation on the second segment and a seed initialization operation on remaining segments will be performed substantially the same as described above, and a description thereof is thus omitted.

As understood from the above description, a seed initialization operation is performed before first data (D0, D1084, D2168, . . . ) of each segment is randomized/de-randomized. Accordingly, a seed assigned to a page is iteratively applied to segments (belonging to one page) each having a size defined by a user.

Figure 6B:
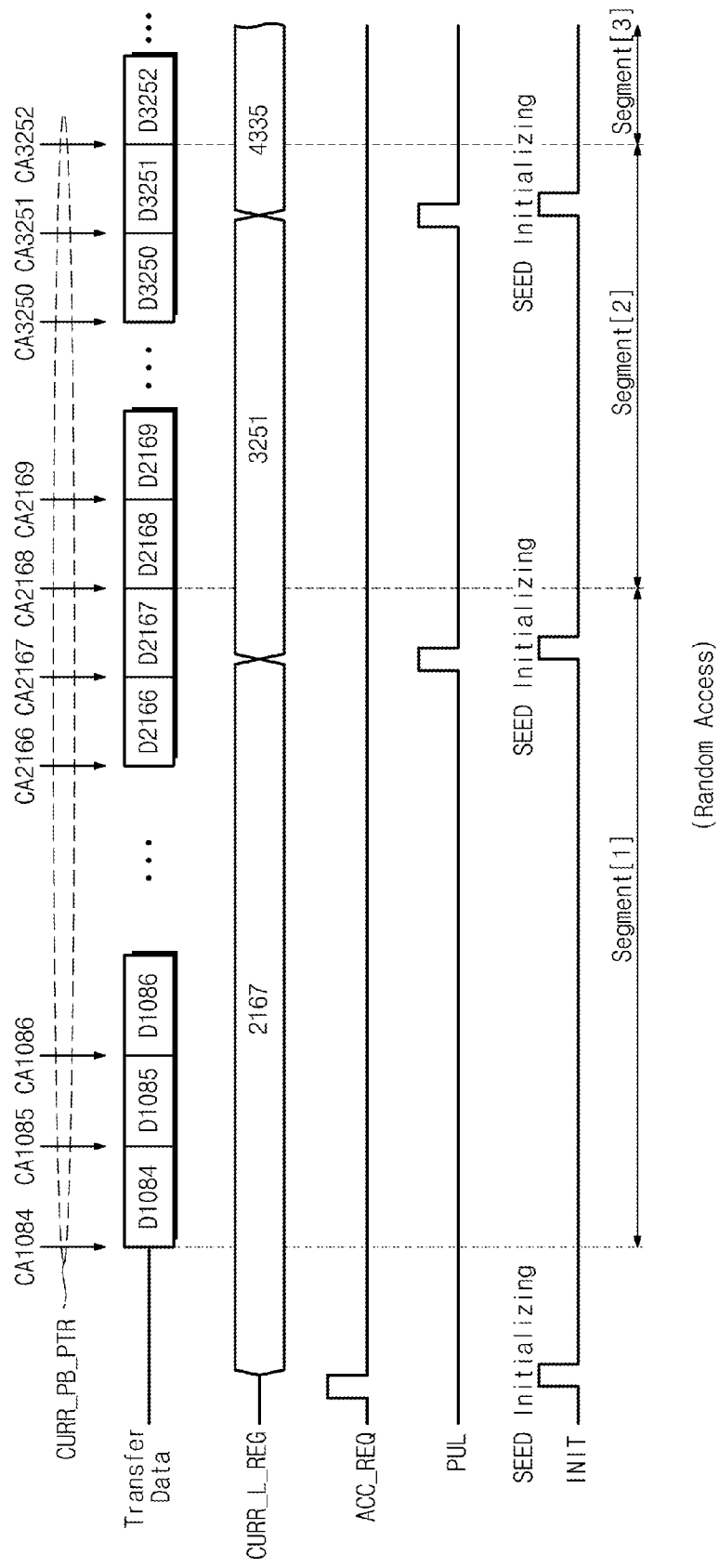

FIG. 6B is a timing diagram for describing an operation of a randomizing and de-randomizing circuit according to an exemplary embodiment of the inventive concept. Below, an operation of a randomizing and de-randomizing circuit according to an exemplary embodiment of the inventive concept will be more fully described with reference to accompanying drawings. Prior to the description, it is assumed that a segment size L is 1084 B (B indicating a byte). Further, it is assumed that a column address input at an access request is CA1084. With the assumptions, a requested access may be a random access for reading one or more segments in full-page data (i.e., a page).

First of all, when a read/write operation is requested, an address corresponding to an access-requested page is sent to a flash memory device. One of seeds of a seed table 610 is selected according to the page address. The selected seed is sent to a pseudo-random sequence generator 630. An access request is completed after a specific command (e.g., 30 h) is received at a read operation and after an address is received at a write operation. Upon completion of an access request, a selection signal ACC_REQ is activated as a signal pulse by control logic 300.

As the selection signal ACC_REQ is activated, an OR gate 626 of a seed initializing part 620 activates an initialization signal INIT as a signal pulse in response to the activated selection signal ACC_REQ. As the initialization signal INIT is activated as a signal pulse, the pseudo-random sequence generator 630 is initialized by a seed provided from the seed table 610. In other words, when the initialization signal INIT is activated, a seed S0-S2 is sent to flip-flops FF0 to FF2 via multiplexers MUX0 to MUX2 of the pseudo-random sequence generator 630. As a result, when the initialization signal INIT is activated, a seed initialization operation is performed such that the pseudo-random sequence generator 630 is initialized by a seed provided from the seed table 610.

As the selection signal ACC_REQ is activated, a selector 623 of the seed initializing part 620 transfers an output AO of a first adder 621 to a register 624. The output AO of the first adder 624 is stored in the register 624 according to activation of the initialization signal INIT. The output AO of the first adder 621 has a value of 2167, that is, a sum of a value CURR_PB_PTR, indicating a current column address CA1084, and a value (SEG_L−1) less by 1 than a segment size. That is, the register 624 is set to a value of 2167. This means that an output CURR_L_REG of the register 624 has a value of 2167. A value stored in the register 624 is used to indicate last data of a currently transferred segment (or, called last segment data) (e.g., D2167). This is to perform a seed initialization operation for randomizing/de-randomizing of first segment data (e.g., D2167) of a next segment.

Following the seed initialization operation, data (e.g., randomized data as read data or data to be programmed) is sent to the randomizing and de-randomizing circuit 600. A mixer 640 logically combines data sent to the randomizing and de-randomizing circuit 600 and random sequence data RSD from a pseudo-random sequence generator 630. That is, data sent to the randomizing and de-randomizing circuit 600 is randomized or de-randomized. As data is sequentially sent to the randomizing and de-randomizing circuit 600, as illustrated in FIG. 6B, a column address CA also increases sequentially. A value CURR_PB_PTR indicating a current column address CA is transferred to a comparator 625 of the seed initializing part 630. The comparator 625 judges whether the output CURR_L_REG (indicating last segment data of a current segment) of the register 624 is coincident with a value CURR_PB_PTR indicating a current column address.

If the output CURR_L_REG of the register 624 is coincident with a value CURR_PB_PTR indicating a current column address, an output PUL of the comparator 625 is activated as a signal pulse. In other words, as illustrated in FIG. 6B, when the output CURR_L_REG of the register 624 is 2167 and a value CURR_PB_PTR indicating a current column address is 2167, the output PUL of the comparator 625 is activated as a signal pulse. That the output of the comparator 625 is activated means that random sequence data RSD for last segment data of a current segment is generated. As the output PUL of the comparator 625 is activated as a signal pulse, the initialization signal INIT is also activated as a signal pulse. This means that a seed (corresponding to an access-requested page) output from the seed table 610 is loaded onto the flip-flops FF2 to FF0 via the multiplexers MUX2 to MUX0 of the pseudo-random sequence generator 630. That is, a seed initialization operation of the pseudo-random sequence generator 630 is performed.

At this time, since the selection signal ACC_REQ is maintained at an inactive state, an output BO of a second adder 622 is sent to the register 624 via the selector 623. When the initialization signal INIT is activated as a signal pulse according to activation of the output PUL of the comparator 625, the output BO of the second adder 622 is loaded onto the register 624. Herein, the output BO of the second adder 622 has a value of 3251, that is, a sum of a segment size SEG_L and an output CURR_L_REG of the register 624. That is, the register 624 is set to a value of 2167 indicating last segment data D2167 of a second segment. This means that an output of the register 624 has a value of 3251.

Afterwards, a data randomizing/de-randomizing operation on the second segment and a seed initialization operation on remaining segments will be performed substantially the same as described above, and a description thereof is thus omitted.

As understood from the above description, a seed initialization operation is performed before first data (D1084, D2168, . . . ) of each segment is randomized/de-randomized. Accordingly, a seed assigned to a page is iteratively applied to segments (belonging to one page) each having a size defined by a user.

FIGS. 7A and 7B are timing diagrams for describing read and write operations of a flash memory device according to an exemplary embodiment of the inventive concept.

First of all, at a write operation, a set of segments SEG[0] to SEG[i−1] as data to be programmed may be received following an input of a command 80h and an address (C1C2R1R2R3) (C indicating a column address and R indicating a row address). Herein, each of the segments SEG[0] to SEG[i−1] is formed of program data and ECC. As illustrated in FIG. 7A, a seed initialization operation is made per segment. The seed initialization operation is substantially the same as described in FIGS. 6A and 6B, and a description thereof is thus omitted. After an input of the segments SEG[0] to SEG[i−1], a ready/busy signal R/B̄ transitions to a low level according to an input of a command 10h. If a program operation is completed, the ready/busy signal R/B̄ transitions to a high level. That is, a write operation is ended.

As illustrated in FIG. 7B, a read operation is performed in response to an input of a series of command 00h, an address C1C2R1R2R3 and command 30h. During the read operation, the ready/busy signal R/B̄ is maintained at a low level. Afterwards, as read data, a series of segments (Segment[0], Segment[1], . . . ) is sequentially output. Herein, each of the segments (Segment[0], Segment[1], . . . ) is formed of program data and ECC. As illustrated in FIG. 7B, a seed initialization operation is performed per segment. The seed initialization operation is substantially the same as described in FIGS. 6A and 6B, and a description thereof is thus omitted. Although not shown in figures, as described in FIGS. 6A and 6B, a first seed initialization operation is performed according to an access request before substantial data randomizing/de-randomizing.

Figure 8:
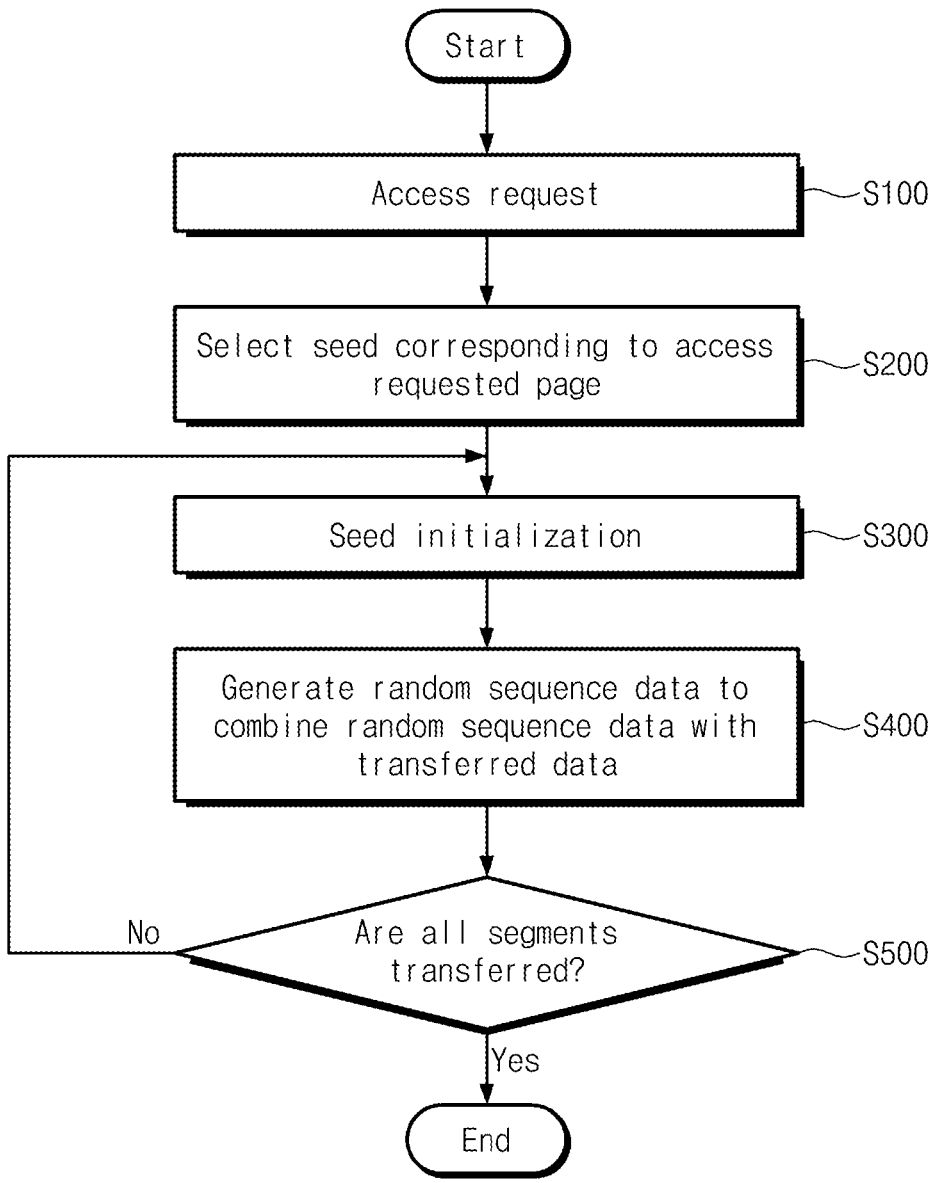
FIG. 8 is a flowchart for describing an operating method of a non-volatile memory device according to an exemplary embodiment of the inventive concept.

FIG. 8 is a flowchart for describing an operating method of a flash memory device according to an exemplary embodiment of the inventive concept. Below, an operating method of a flash memory device according to an exemplary embodiment of the inventive concept will be more fully described with reference to accompanying drawings.

Referring to FIG. 8, an operating method of a flash memory device comprises receiving an access request (S100); selecting a seed corresponding to an access-requested page (S200); performing a seed initialization operation in which a pseudo-random sequence generator 630 is initialized by the selected seed (S300); generating random sequence data to combine it with transferred data (S400); and judging whether all segments are transferred (that is, whether access requested segments are all transferred) (S500). If all segments are not transferred, the operating method proceeds to operation S300 for performing the seed initialization operation. On the other hand, if all segments are transferred, the operating method of the flash memory device is ended.

In an exemplary embodiment, an operation for defining a segment size L is performed before a normal access request described in FIG. 8.

Figure 9A:
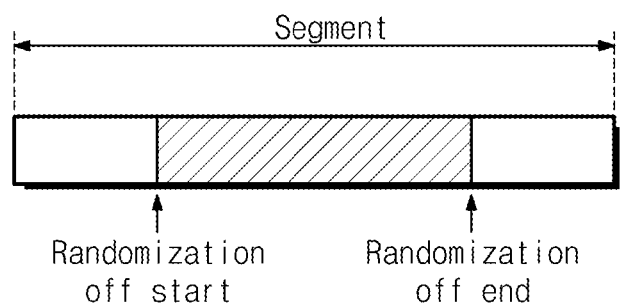
FIGS. 9A and 9B are diagrams for describing a randomization region decided by setting a randomization on/off function.
Figure 9B:
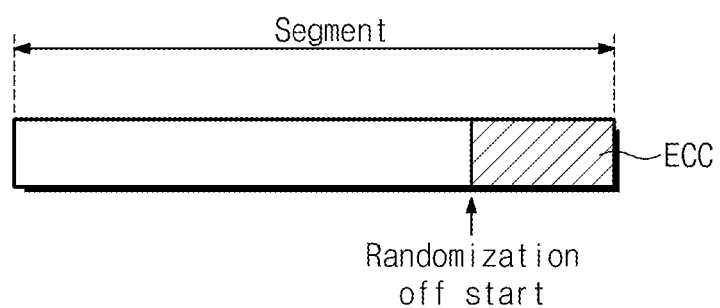

FIGS. 9A and 9B are diagrams for describing a randomization region decided by setting a randomization on/off function.

Data D0 to Dn provided with a set feature command (or, a test command) includes a parameter value for setting a segment size and a parameter value indicating randomization on/off information and/or randomization off region information. For example, as illustrated in FIG. 9A, data provided with the set feature command (or, the test command) includes an on/off flag indicating randomization on/off information and randomization off region information. A part of a segment (a slashed region in a drawing) (hereinafter, referred to as a randomization off region) is appointed by a randomization off start address (or, pointer) and a randomization off end address (or, pointer) as randomization off region information. In this case, data of the remaining portion except for the randomization off region may be randomized. A method of appointing a randomization off region can be changed variously. For example, when only a randomization off start address (or, pointer) is provided, as a randomization off region, there is decided a region ranging from an access point appointed by a randomization off start address up to an end of a segment. That is, as illustrated in FIG. 9B, in the event that a region corresponding to segment parity information is defined as a randomization off region, a randomization off start address is only included in a parameter value. It is well understood that a randomization off region includes a region storing spare data and/or monitoring data. Herein, the monitoring data includes a monitoring data pattern for controlling an MLC read level. This is disclosed in KR laid-open Patent Publication No. 2009-0066680 (a counterpart of U.S. Publication Patent No. 2009-0164710) titled "SEMICONDUCTOR MEMORY SYSTEM AND ACCESS METHOD THEREOF", the entirety of which is incorporated by reference herein.

In an exemplary embodiment, a randomize on-read/off-read command can be used instead of a set feature command.

In an exemplary embodiment, a unit of a randomization off region is variously determined. For example, the randomization off region unit may be formed of any size within a segment, one or more segments, one or more pages, one or more memory blocks, one or more plans, one or more channels, or a combination thereof.

In an exemplary embodiment, a randomization on/off function can be set automatically according to a wear index. For example, the wear index includes a program-erase cycle, a program time (or, a program loop number), an erase time (or, an erase loop number), a read level shift (or, a charge loss), and the like. A memory controller may automatically set the randomization on/off function of a flash memory device based on the wear index.

Although not shown in figures, it is well understood that setting of the randomization on/off function may be applied to not only randomization but also de-randomization.

Figure 10:
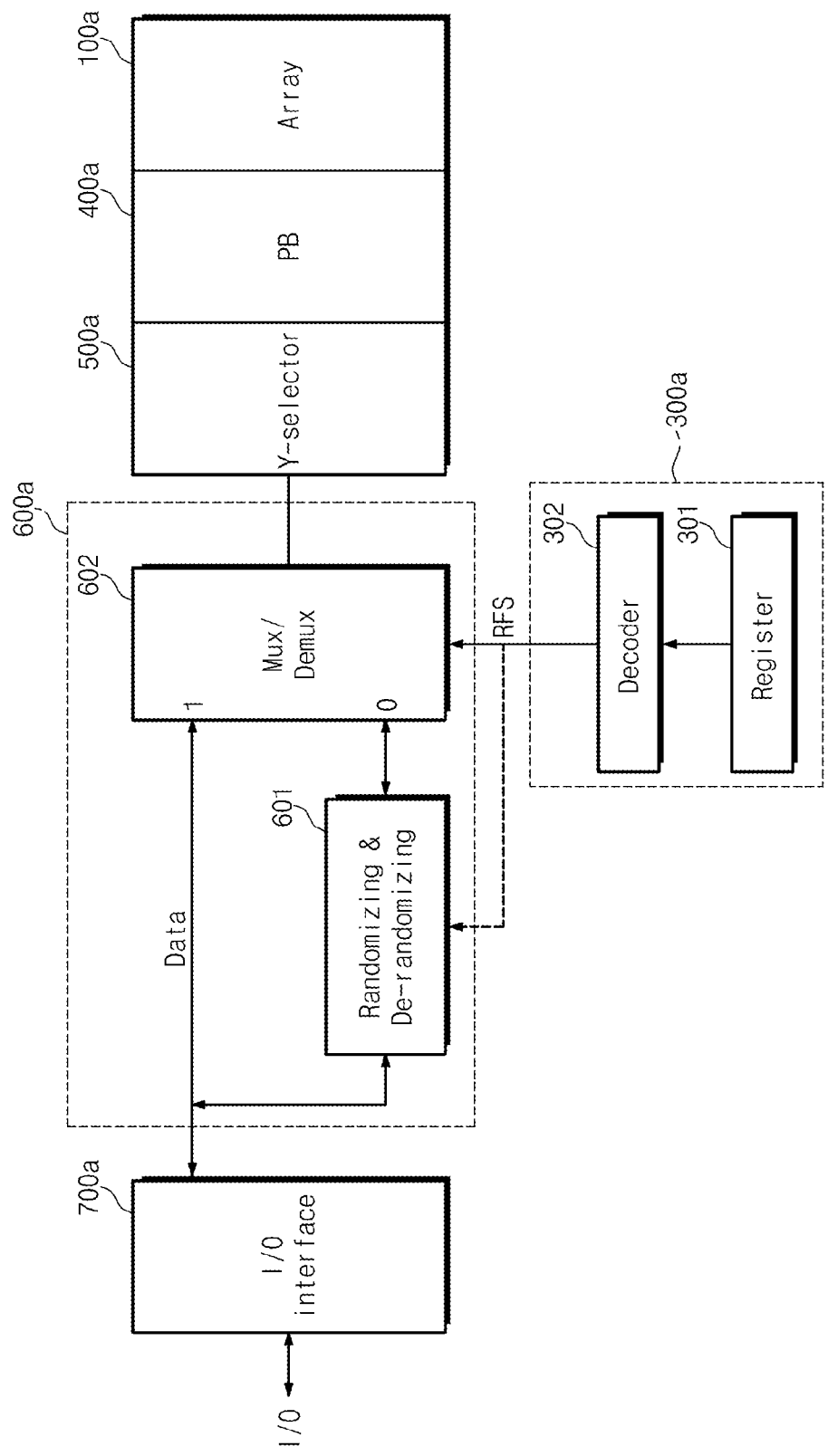
FIG. 10 is a block diagram of a non-volatile memory device according to another exemplary embodiment of the inventive concept.

FIG. 10 is a block diagram of a flash memory device according to another exemplary embodiment of the inventive concept.

Referring to FIG. 10, a flash memory device includes a memory cell array 100a, control logic 300a, a page buffer circuit 400a, a column selector circuit 500a, a randomizing and de-randomizing circuit 600a, and an input/output interface 700a. The memory cell array 100a, the control logic 300a, the page buffer circuit 400a, the column selector circuit 500a, and the input/output interface 700a operate substantially the same as illustrated in FIG. 1, and a description thereof is thus omitted.

The control logic 300a includes a register 301 and a decoder 302. The register 301 is set by a parameter value (e.g., including randomization off region information and randomization on/off information) received with a set feature command. The decoder 302 decodes the parameter value stored in the register 301 to generate a randomization off flag signal RFS. The randomization off flag signal RFS is activated according to whether a current column offset value belongs to a randomization off region stored in the register 301 at an access request. Activation of the randomization off flag signal RFS means that a randomization function is off. The decoder 302 may be formed of a counter, a comparator comparing a value of the counter and a start address of the randomization off region, and the like.

The randomizing and de-randomizing circuit 600a is placed between the input/output interface 700a and the column selector circuit 500a, and makes randomization/de-randomization of transferred data (program data or read data). The randomizing and de-randomizing circuit 600a includes a randomizing and de-randomizing unit 601 and a multiplexer/demultiplexer 602. The randomizing and de-randomizing unit 601 operates substantially the same as that illustrated in FIG. 3, and a description thereof is thus omitted.

The multiplexer/demultiplexer 602 operates in response to the randomization off flag signal RFS, and selects data transferred from the input/output interface 700a or data output from the randomizing and de-randomizing unit 601. For example, when the randomization off flag signal RFS is activated (that is, a randomization function is off), the multiplexer/demultiplexer 602 selects data (i.e., data not randomized) transferred from the input/output interface 700a. The multiplexer/demultiplexer 602 selects data (i.e., randomized data) output from the randomizing and de-randomizing unit 601 in response to inactivation of the randomization off flag signal RFS. The multiplexer/demultiplexer 602 operates responsive to the randomization off flag signal RFS, and transfers data output from the column selector circuit 500a to any one of the input/output interface 700a and the randomizing and de-randomizing unit 601. For example, the multiplexer/demultiplexer 602 transfers data output from the column selector circuit 500a to the input/output interface 700a in response to activation of the randomization off flag signal RFS. The multiplexer/demultiplexer 602 transfers data output from the column selector circuit 500a to the randomizing and de-randomizing unit 601 in response to inactivation of the randomization off flag signal RFS.

In an exemplary embodiment, the randomizing and de-randomizing unit 601 is configured to provide the randomization off flag signal RFS as illustrated by a dotted line in FIG. 10. This is to selectively operate the randomizing and de-randomizing unit 601 according to a size of a random off region. For example, in the event that randomization on/off is made by the segment, the randomizing and de-randomizing unit 601 is not affected by the randomization off flag signal RFS. In the event that randomization on/off is made by the page/block/plan, the randomizing and de-randomizing unit 601 is affected by the randomization off flag signal RFS such that it does not operate during an input of data to which the randomization on/off is applied.

As is understood from the above description, it is possible to activate or inactivate a randomization/de-randomization function based upon a parameter value set in the register 301.

Figure 11A:
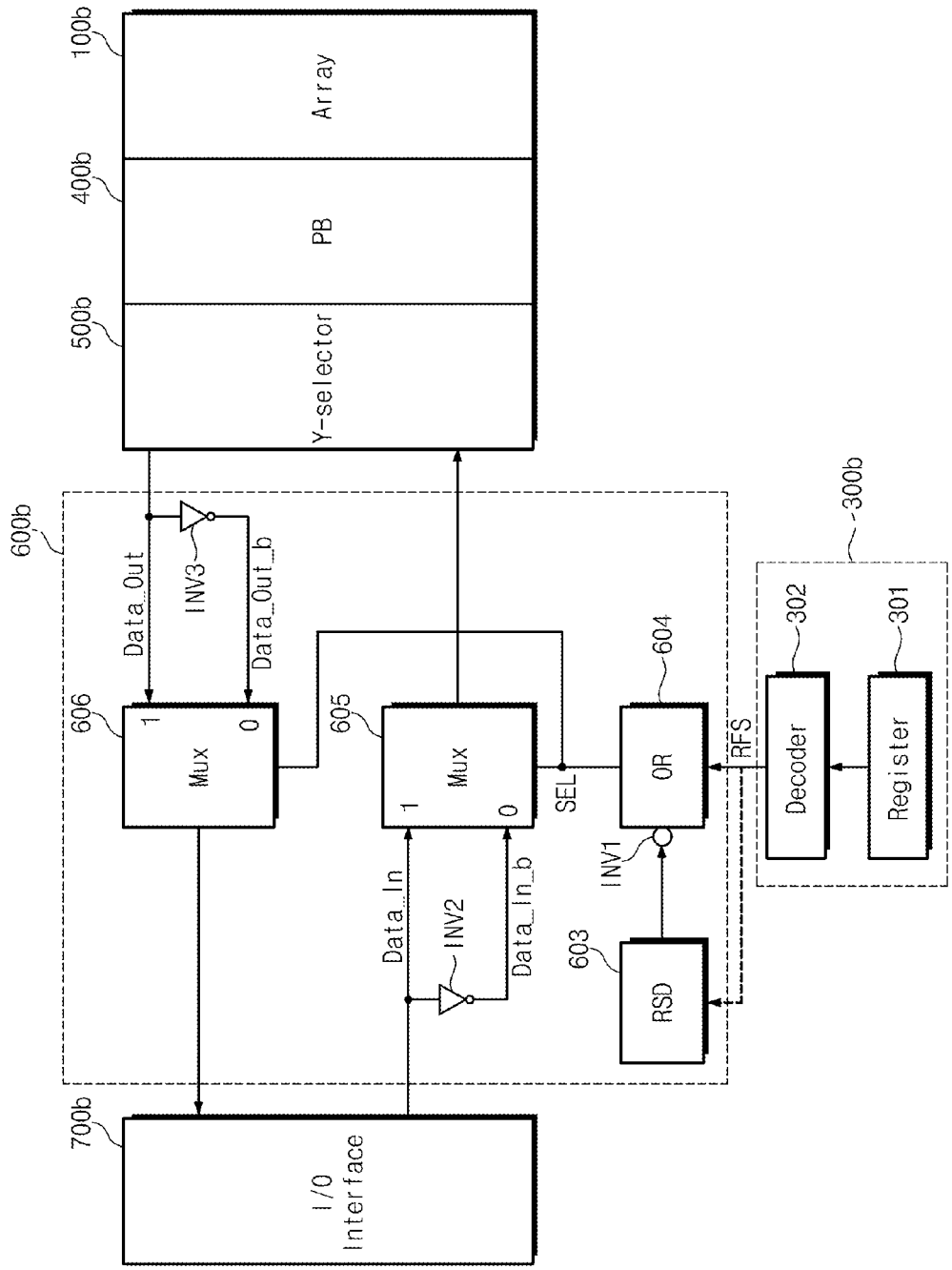
FIG. 11A is a block diagram of a non-volatile memory device according to still another exemplary embodiment of the inventive concept.

FIG. 11A is a block diagram of a flash memory device according to still another exemplary embodiment of the inventive concept.

Referring to FIG. 11A, a flash memory device includes a memory cell array 100b, control logic 300b, a page buffer circuit 400b, a column selector circuit 500b, a randomizing and de-randomizing circuit 600b, and an input/output interface 700b. The memory cell array 100b, the control logic 300b, the page buffer circuit 400b, the column selector circuit 500b, and the input/output interface 700b in FIG. 11A operate substantially the same as illustrated in FIG. 10, and a description thereof is thus omitted.

The randomizing and de-randomizing circuit 600b includes a random sequence data generating unit 603, an OR gate 604, and first and second multiplexers 605 and 606. The random sequence data generating unit 603 is configured to be identical to that in FIG. 3 except that a mixer 630 is eliminated. For example, the random sequence data generating unit 603 includes a seed table 610, a seed initializing part 620, and a pseudo-random sequence generator 630. Random sequence data (e.g., 1-bit random sequence data) sequentially generated by the random sequence data generating unit 603 is provided to the OR gate 604 via an inverter INV1. The OR gate 604 outputs a selection signal SEL in response to a randomization off flag signal RFS and inverted random sequence data.

The first multiplexer 605 operates responsive to the selection signal SEL, and selects one of data Data_In output from the input/output interface 700b and data Data_In_b inverted via an inverter INV2. For example, in the event that the randomization off flag signal RFS is activated high, the randomization function becomes off. In this case, the selection signal has a logic high level regardless of a value of random sequence data. If the selection signal SEL has a logic high level, the first multiplexer 605 selects data Data_In, not inverted data Data_In_b. That is, a data randomization function is bypassed. In the event that the randomization off flag signal RFS is inactivated low, the randomization function becomes on. In this case, the selection signal SEL has a logic high level and a logic low level according to a value of random sequence data, not fixed to a logic high level or a logic low level. As the selection signal SEL has a logic high level and a logic low level according to a value of random sequence data, the first multiplexer 605 selects data Data_In and inverted data Data_In_b according to a value of random sequence data. That is, the data randomization is performed.

The second multiplexer 606 operates responsive to the selection signal SEL, and selects one of data Data_Out output from the column selector circuit 500B and data Data_Out_b inverted via an inverter INV3. If the selection signal SEL has a logic high level, the second multiplexer 606 selects data Data_Out. That is, data de-randomization is bypassed.

In the event that the randomization off flag signal RFS is inactivated low, the de-randomization function becomes on. In this case, the selection signal SEL has a logic high level and a logic low level according to a value of random sequence data. As the selection signal SEL has a logic high level and a logic low level according to a value of random sequence data, the second multiplexer 606 selects data Data_Out and inverted data Data_Out_b according to a value of random sequence data. That is, the data de-randomization is performed.

Figure 11B:
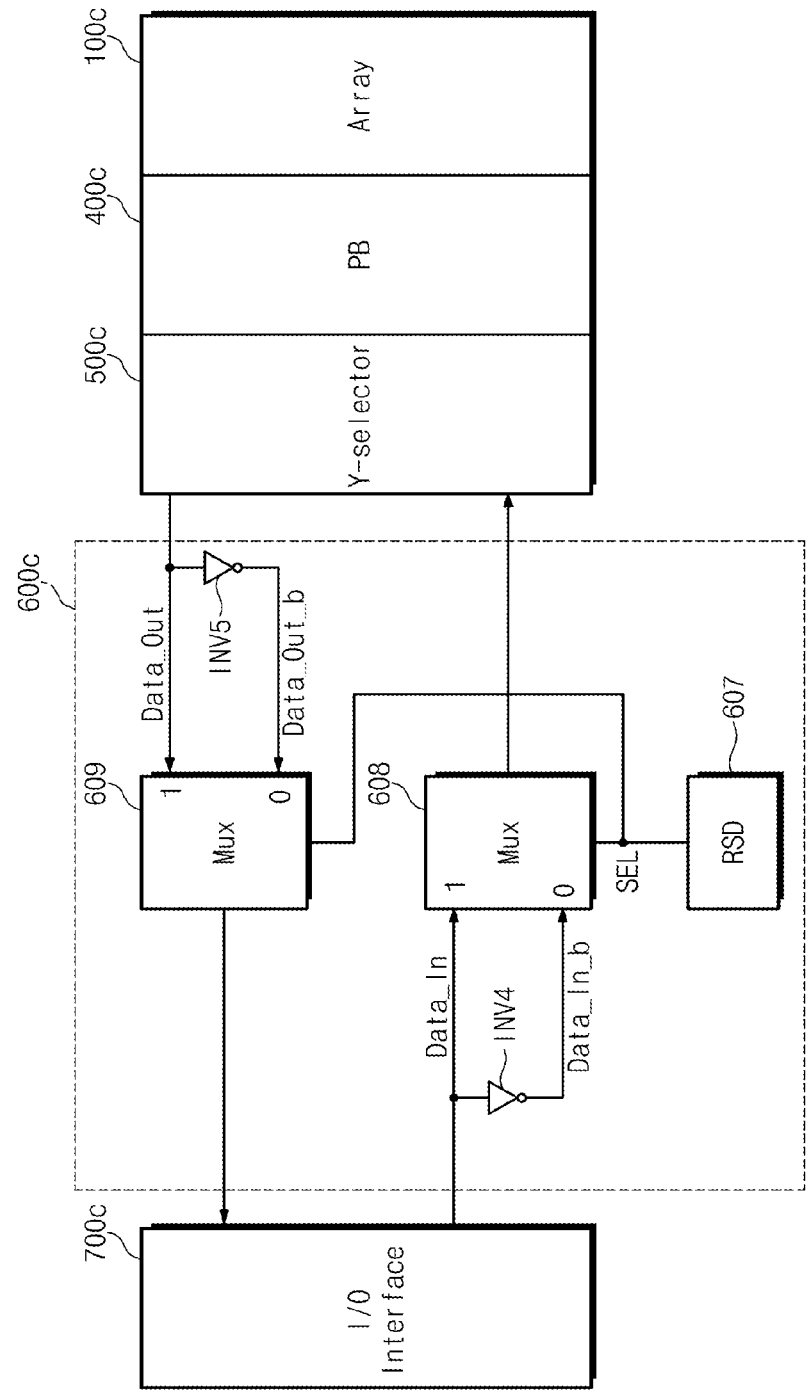
FIG. 11B is a block diagram of a non-volatile memory device according to still another exemplary embodiment of the inventive concept.

FIG. 11B is a block diagram of a flash memory device according to still another exemplary embodiment of the inventive concept.

Referring to FIG. 11B, a flash memory device includes a memory cell array 100c, a page buffer circuit 400c, a column selector circuit 500c, a randomizing and de-randomizing circuit 600c, and an input/output interface 700c. The memory cell array 100c, the page buffer circuit 400c, the column selector circuit 500c, and the input/output interface 700c in FIG. 11B operate substantially the same as illustrated in FIG. 11A, and a description thereof is thus omitted.

The randomizing and de-randomizing circuit 600c in FIG. 11B is substantially the same as that in FIG. 11A except that an output of a random sequence data generator 607, that is, random sequence data is used as a selection signal SEL of multiplexers 608 and 609, and a description thereof is thus omitted.

Figure 12:
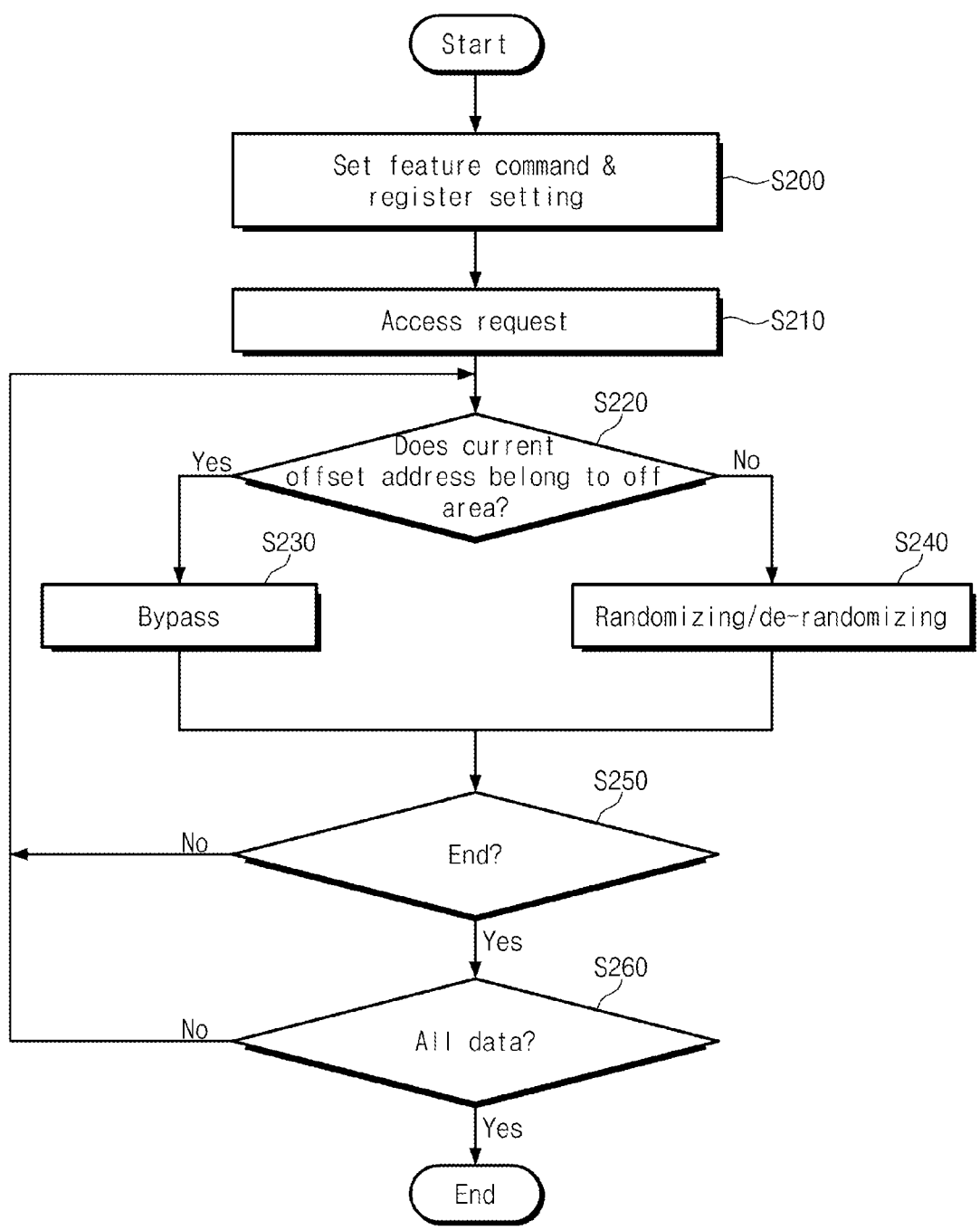
FIG. 12 is a flowchart for describing an operation of a non-volatile memory device having a randomization on/off function described in FIGS. 10 and 11A.

FIG. 12 is a flowchart for describing an operation of a flash memory device having a randomization on/off function described in FIGS. 10 and 11A. For ease of description, it is assumed that a randomization off region is set to a specific region of a segment (e.g., a region corresponding to ECC/parity data in FIG. 9B).

As described above, a segment size SEG_L of a flash memory device is set using a set feature command (or, a test command). A register (e.g., 301) of control logic 300a/b is set by region information for appointing a randomization off region, randomization on/off information, and a parameter value indicating the segment size SEG_L. This is performed in operation S200. This operation (setting of a segment size and/or setting of randomization on/off) is performed after power-up or as necessary.

In operation S210, an access (a read/write operation) to the flash memory device is requested. In operation S220, there is judged whether a current offset address input at an access request belongs to a randomization off region set in the register 301. This is performed by the control logic 300a/b. If the current offset address input at the access request does not belong to the randomization off region set in the register 301, data is transferred without randomization/de-randomization. Afterwards, the procedure goes to operation S250. If the current offset address input at the access request belongs to the randomization off region set in the register 301, transferred data is randomized/de-randomized. This is performed to be substantially the same as that described in FIGS. 10 and 11A. Afterwards, the procedure goes to operation S250.

In operation S250, there is judged whether data (e.g., 512-byte) corresponding to a unit of a randomization off region is all transferred. For example, there is judged whether data (e.g., 512-byte) corresponding to one segment is all transferred. If not, the procedure goes to operation S220. If so, the procedure goes to operation S260. In operation S260, there is judged whether access-requested data is all transferred. If not, the procedure goes to operation S220. If so, the procedure is ended.

Figure 13:
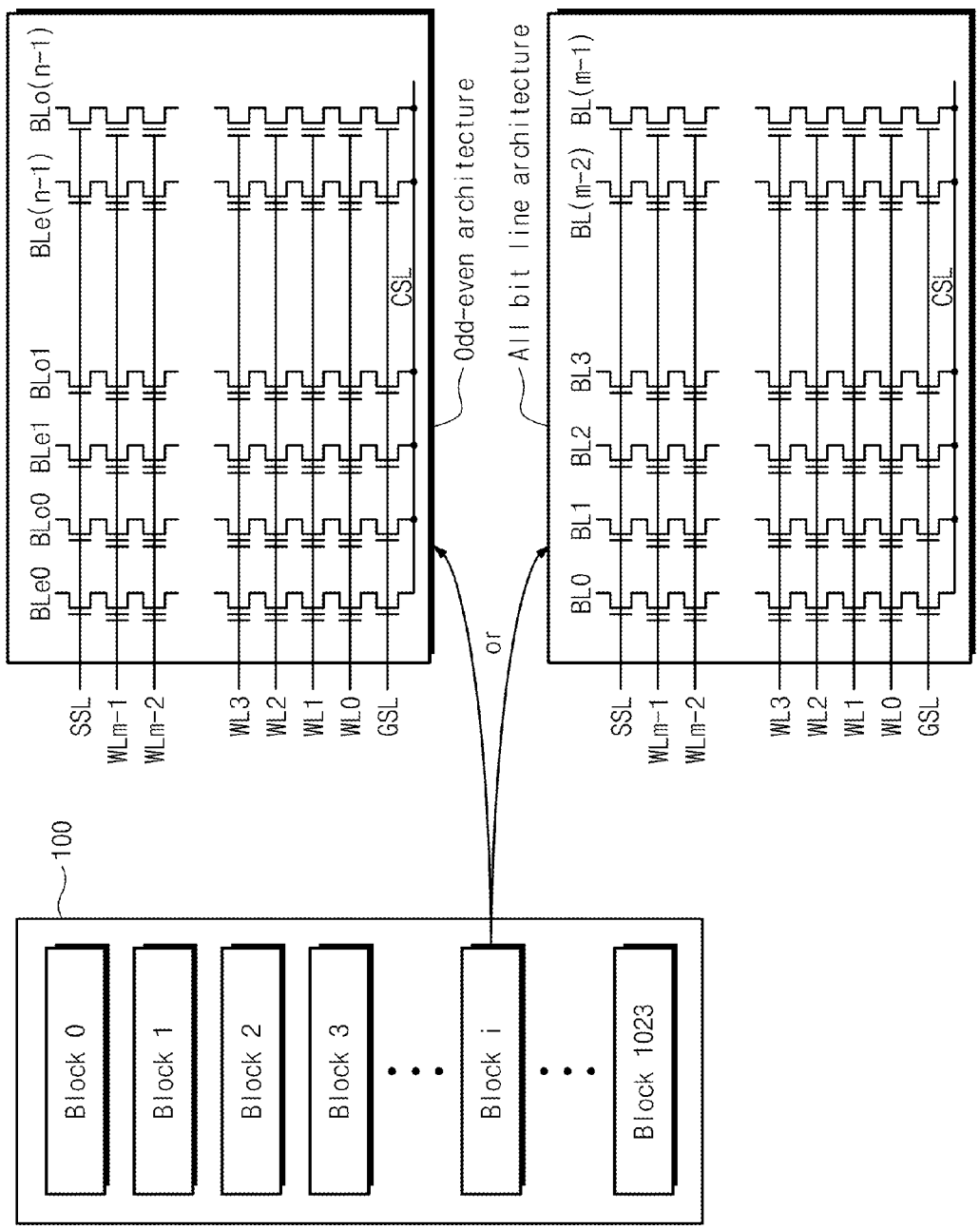
FIG. 13 is a diagram showing examples of blocks of a memory cell array illustrated in FIG. 1 being formed of an all bit line memory structure or an odd-even memory structure.

FIG. 13 is a diagram showing an example that a memory cell array illustrated in FIG. 1 which is formed of memory blocks for the all bit line memory structure or the odd-even memory structure. Exemplary structures of a memory cell array 100 will be described. As one example, a NAND flash memory device including a memory cell array 100 partitioned into 1,024 blocks will now be described. The data stored in each block may be simultaneously erased or by a memory sub-block unit. In one embodiment, the memory block or memory sub-block is the minimum unit of storage elements that are simultaneously erased. Each memory block, for example, has columns each corresponding to bit lines (e.g., bit lines of 1 KB). In one embodiment referred to as the all bit line (ABL) architecture, all the bit lines of a memory block are capable of being simultaneously selected during read and program operations. Storage elements in a word line selected by a row selector circuit 200 and connected to all bit lines is capable of being programmed at the same time.

In an exemplary embodiment, a plurality of storage elements in the same column is connected in series to form a NAND string. One end of the NAND string is connected to a corresponding bit line via a select transistor which is controlled by a string select line SSL, and the other end is connected to a common source line CSL via a select transistor which is controlled by a ground select line GSL.

In another embodiment referred to as the odd-even architecture, bit lines are divided into even bit lines (BLe) and odd bit lines (BLo). In the odd/even bit line architecture, storage elements in a selected word line and connected to the odd bit lines are programmed at the first time, while storage elements in the common word line and connected to even bit lines are programmed at the second time.

Figure 14:
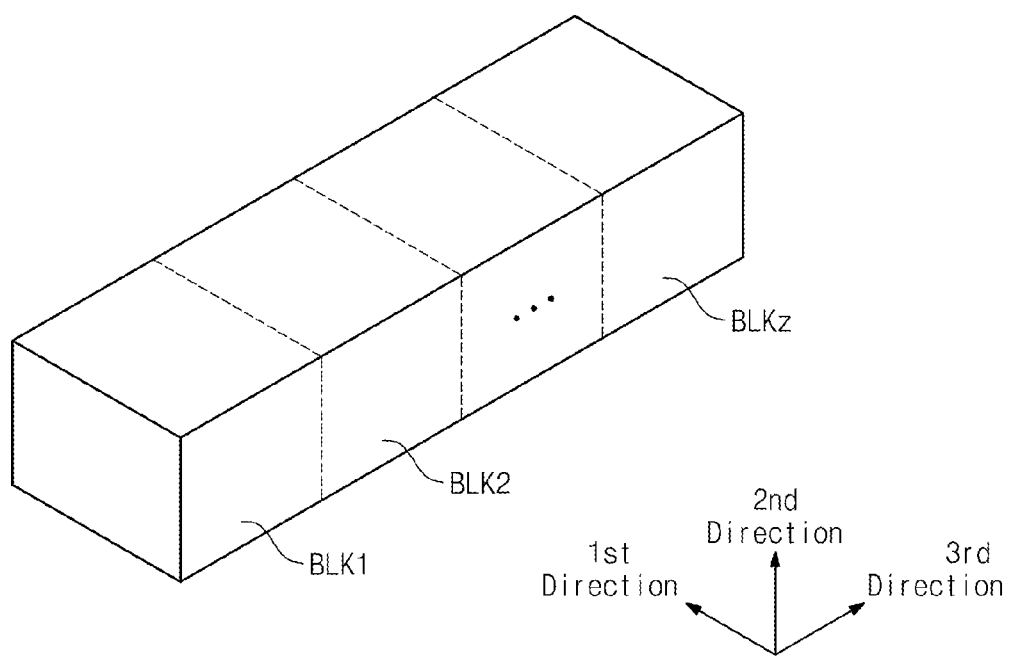
FIG. 14 is a diagram showing a memory cell array according to another exemplary embodiment of the inventive concept.

FIG. 14 is a diagram showing a memory cell array according to another exemplary embodiment of the inventive concept. A memory cell array according to another exemplary embodiment of the inventive concept is configured to have a vertical structure. The vertical structure means that a string is formed to extend vertically relative to a horizontal principal surface of a substrate.

Referring to FIG. 14, a memory cell array 100a includes a plurality of memory blocks BLK1 to BLKz, each of which has a three-dimensional structure (or, a vertical structure). For example, each of the memory blocks BLK1 to BLKz includes structures extending along first to third directions. For example, each of the memory blocks BLK1 to BLKz includes a plurality of strings (or, NAND strings) extending along the second direction. As another example, a plurality of strings (or, NAND strings) extending along the first or third direction is provided. Exemplarily, the memory blocks BLK1 to BLKz may be selected by a row selector circuit 200 in FIG. 1.

Figure 15:
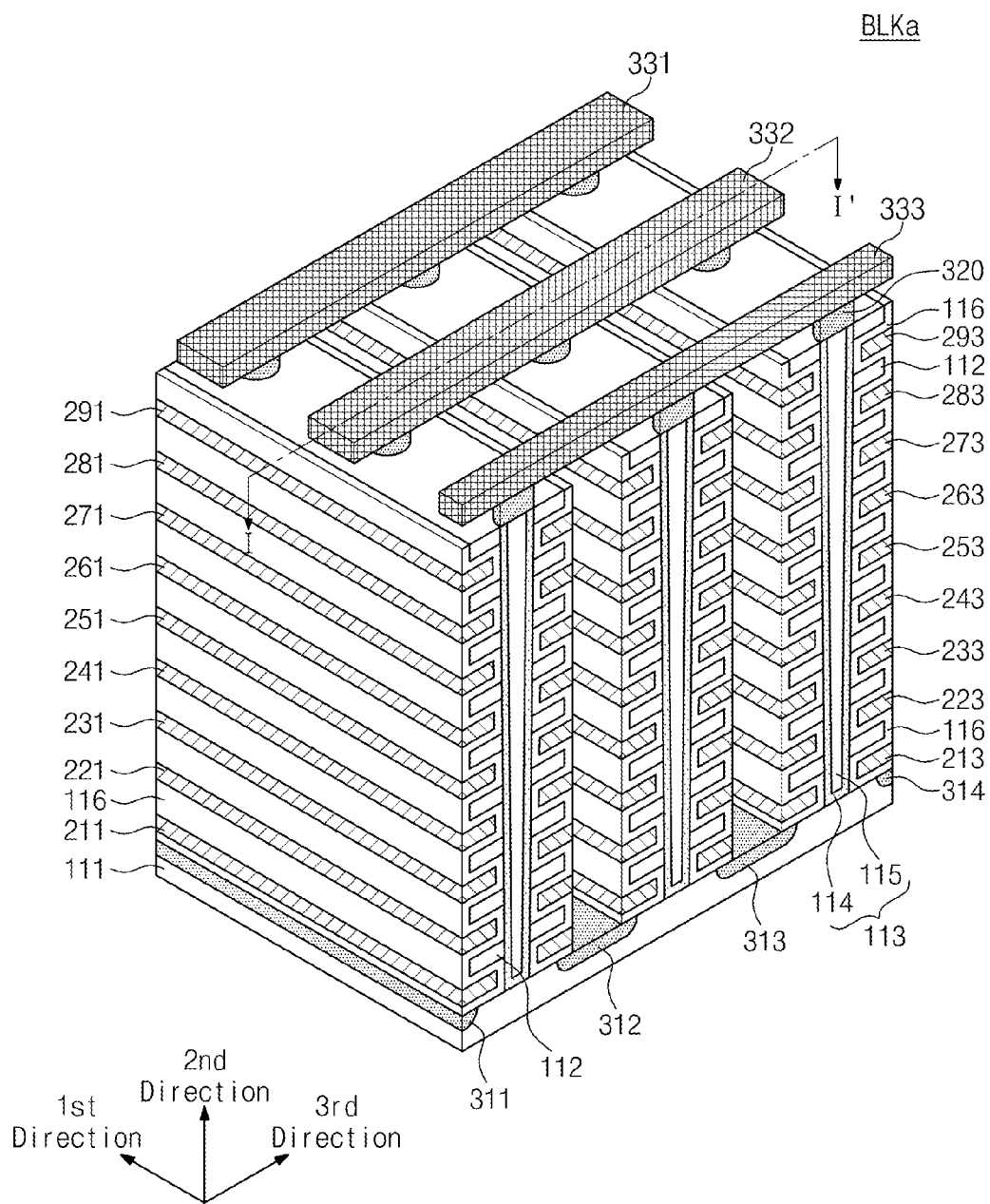
FIG. 15 is a perspective view of one of memory blocks in FIG. 14.
Figure 16:
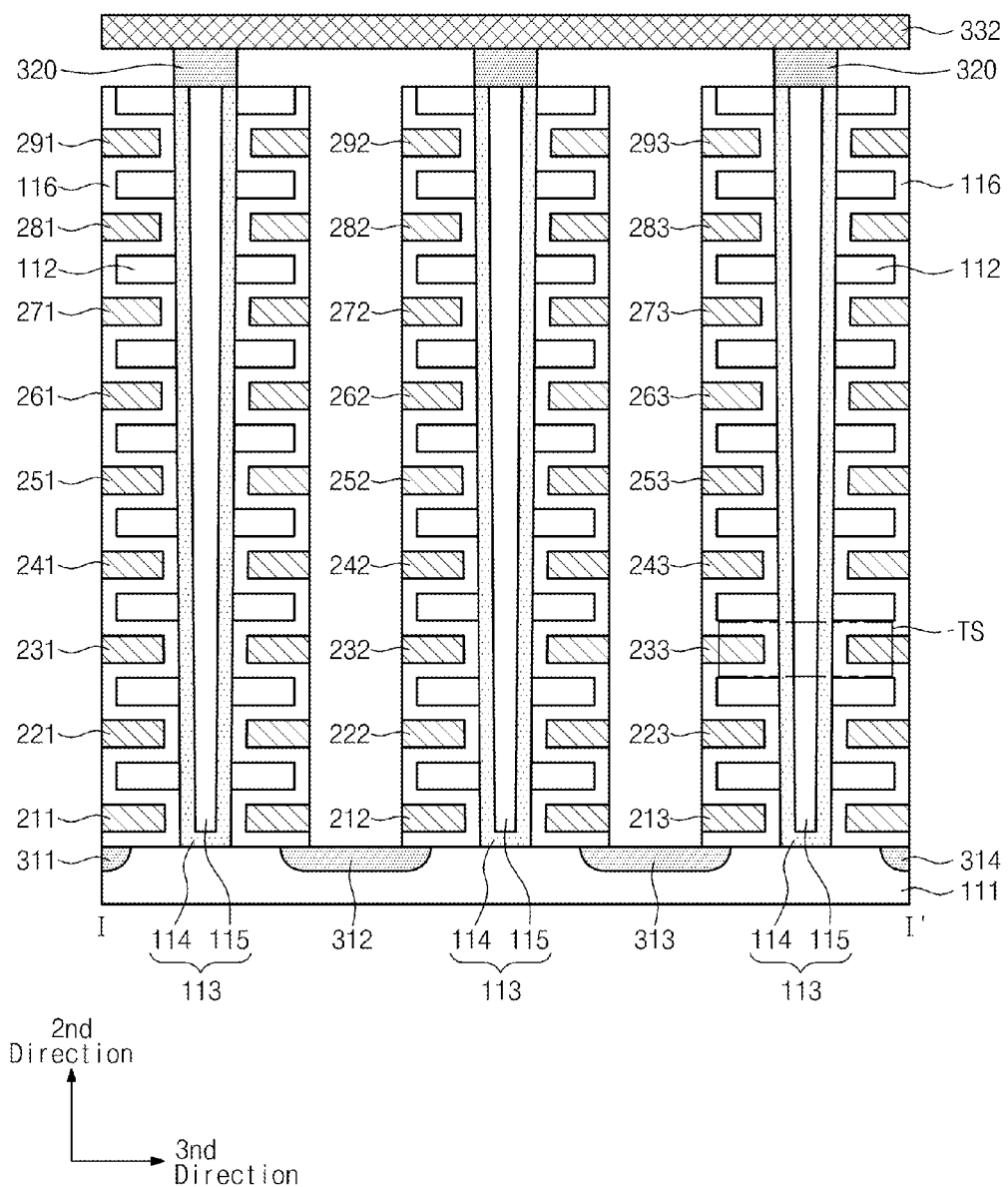
FIG. 16 is a cross-sectional view taken along a line I-I' of a memory block in FIG. 15.

FIG. 15 is a perspective view of one of memory blocks in FIG. 14, and FIG. 16 is a cross-sectional view taken along a line I-I' of a memory block in FIG. 15. Referring to FIGS. 15 and 16, a memory block BLKa includes structures that extend along first to third directions.

First, a substrate 111 is provided. Exemplarily, the substrate 111 is a well having a first type. As an example, the substrate 111 is pocket p-well provided within an n-well. For example, the substrate 111 is a p-well formed by injecting a group 5 element such as boron. Hereinafter, it is assumed that the substrate 111 is a p-well. However, it is well understood that the substrate 111 is not limited thereto.

A plurality of doping regions 311 to 314 extending in the first direction is provided onto the substrate 111. For example, a plurality of doping regions 311 to 314 has a second type different from that of the substrate 111. For ease of illustration, only four doping regions 311 to 314 are illustrated in FIG. 15. Herein, it is assumed that the doping regions 311 to 314 have n-type conductivities, respectively. However, the doping regions 311 to 314 are not limited thereto.

On the substrate 111 between the doping regions 311 and 312, a plurality of insulating materials 112 extending along the direction is sequentially provided along the second direction. For example, the insulating materials 112 are separated by a predetermined distance in the second direction. Exemplarily, the insulating materials 112 include an insulating material such as silicon oxide.

On the substrate 111 between the doping regions 311 and 312, a plurality of pillars 113 is provided which are sequentially disposed in the first direction and pass through the insulating materials 112 in the second direction. Exemplarily, the pillars 113 are connected to the substrate 111 through the insulating materials 112, respectively. Exemplarily, each of the pillars 113 is formed of a plurality of materials. For example, a surface layer 114 of each pillar 113 includes a silicon material having the first type. As another example, the surface layer 114 of each pillar 113 includes a silicon material which is doped by the same type as the substrate 111. Hereinafter, it is assumed that the surface layer 114 of each pillar 113 includes p-type silicon. However, the surface layer 114 of each pillar 113 is not limited thereto. An inner layer 115 of each pillar 113 is formed of an insulating material. For example, the inner layer 115 of each pillar 113 includes an insulating material such as silicon oxide. Alternatively, the inner layer 115 of each pillar 113 includes an air gap.

Referring to each structure disposed between adjacent doping regions, an insulation film 116 is provided along the insulating materials 112, the pillar 113, and an exposed surface of the substrate 111. Exemplarily, the insulating film 116 is provided along an exposed surface of the substrate 111. Exemplarily, there is removed the insulating film 116 provided on an exposed surface in the second direction of the last insulating material 112 provided along the second direction. The insulating film 116 is formed of one or more material layers. First conductive materials 211 to 291 are provided on the exposed surface of the insulating film 116. For example, the first conductive material 211 extending along the first direction is provided between the substrate 111 and the insulating material 112 adjacent to the substrate 111. Exemplarily, the first conductive materials 211 to 291 are a metallic material. As another example, the first conductive materials 211 to 291 are a conductive material such as poly silicon.

A structure disposed between doping regions 312 and 313 is configured the same as that disposed between doping regions 311 and 312. Likewise, a structure disposed between doping regions 313 and 314 is configured the same as that disposed between doping regions 311 and 312.

Plugs 320 are provided on the plurality of pillars 113, respectively. Exemplarily, the plugs 320 are silicon materials that are doped in a second type. For example, the plugs 320 are silicon materials that are doped in an n-type. Hereinafter, it is assumed that the plugs 320 include n-type silicon. However, the plugs 320 are not limited thereto. Exemplarily, the width of each of the plugs 320 is greater than that of a corresponding pillar 113. For example, each plug 320 is provided in a pad shape on the upper surface of a corresponding pillar 113. Second conductive materials 331 to 333 extending along the third direction are provided to be electrically connected with the plugs 320. The second conductive materials 331 to 333 are sequentially disposed along the first direction. As another example, the second conductive materials 331 to 333 are conductive materials such as poly silicon.

In FIG. 16, a structure disposed between adjacent doping regions (e.g., 311 and 312) includes pillars 113 which are electrically connected with conductive materials (e.g., 331, 332, and 333) acting as bit lines, respectively. The pillars 113 electrically connected with conductive materials (e.g., 331, 332, and 333) acting as bit lines respectively form a plane. This means that one memory block is formed of a plurality of planes. In FIGS. 15 and 16, conductive materials 211, 212, and 213 act as a ground selection line, conductive materials 291, 292, and 293 act as a string selection line, doping regions 311 to 314 act as a common source line, and conductive materials 221 to 281, 222 to 282, and 223 to 283 act as a word line.

Figure 17:
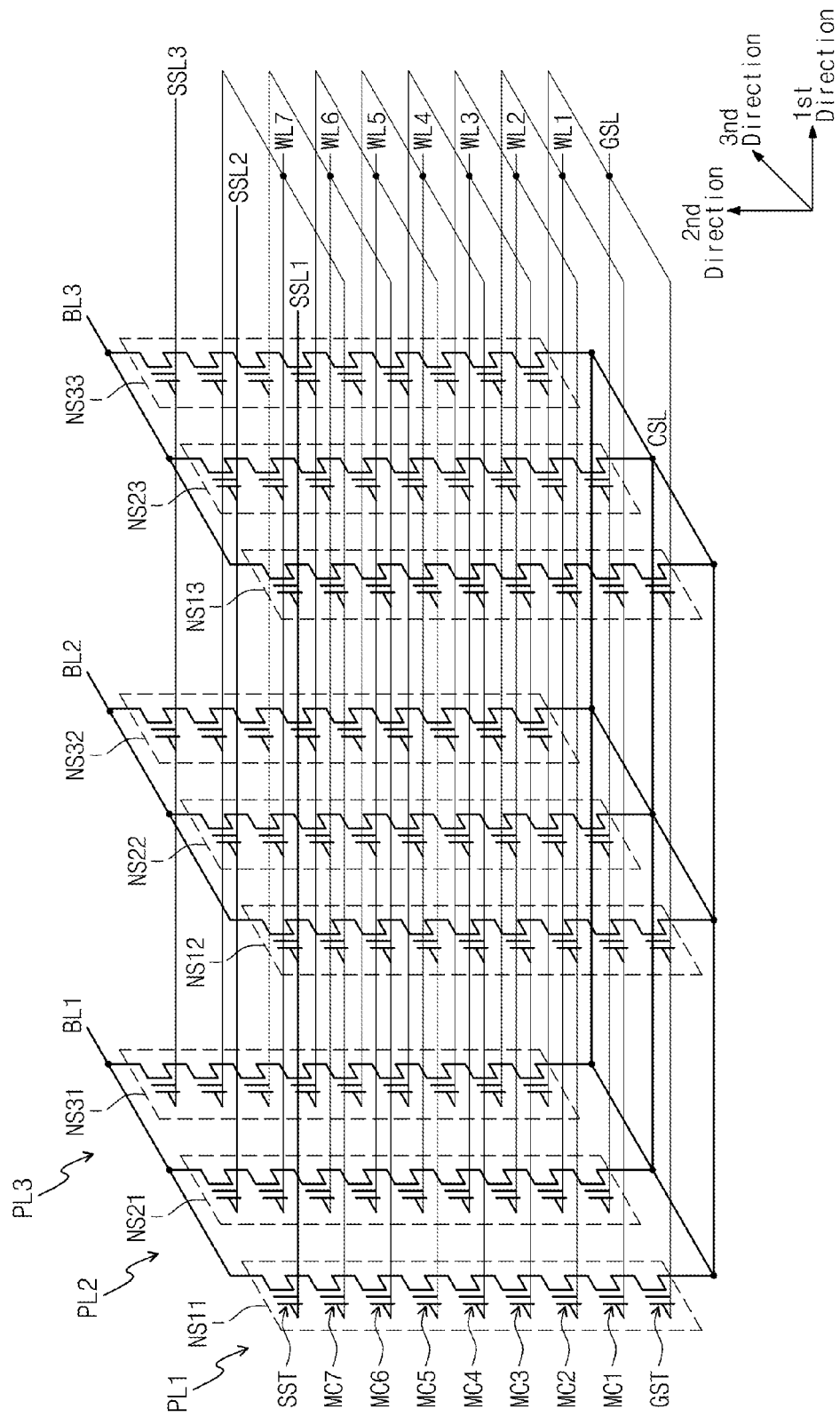
FIG. 17 is an equivalent circuit diagram of a memory block described in FIG. 16.

FIG. 17 is an equivalent circuit diagram of a memory block described in FIG. 16.

Referring to FIG. 17, NAND strings are provided between bit lines and a common source line CSL. For example, NAND strings NS11, NS21 and NS31 are provided between a bit line BL1 and the common source line CSL. NAND strings NS12, NS22 and NS32 are provided between a bit line BL2 and the common source line CSL. NAND strings NS13, NS23 and NS33 are provided between a bit line BL3 and the common source line CSL. The bit lines B11 to BL3 correspond to second conductive materials 331 to 333 (refer to FIG. 15) extending in the third direction.

A string selection transistor SST of each NAND string is connected to a corresponding bit line BL. A ground selection transistor GST of each NAND string is connected to the common source line CSL. In each NAND string, memory cells MC are provided between the string selection transistor SST and the ground selection transistor GST.

The NAND strings NS connected to one bit line in common form one column. For example, the NAND strings NS11 to NS31 connected to the bit line BL1 correspond to a first column. The NAND strings NS12 to NS32 connected to the bit line BL2 correspond to a column. The NAND strings NS13 to NS33 connected to the bit line BL3 correspond to a third column. The NAND strings connected to one string selection line SSL form one row. For example, the NAND strings NS11 to NS13 connected to a string selection line SSL1 form a first row. The NAND strings NS21 to NS23 connected to a string selection line SSL2 form a second row. The NAND strings NS31 to NS33 connected to a string selection line SSL3 may form a row.

As illustrated in FIG. 17, NAND strings arranged in rows and columns share a ground selection line GSL. Memory cells in each row (or, each plane) share word lines WL1 to WL7 each arranged at different layers. For example, memory cells MC1 belonging to a plane PL1 and adjacent to ground selection transistors GST share the word line WL1, and memory cells MC7 belonging to a plane PL1 and adjacent to string selection transistors SST share the word line WL7.

NAND strings in the same row/plane share a string selection line. For example, NAND strings NS11, NS12, and NS13 in a plane PL1 share a string selection line SSL1, NAND strings NS21, NS22, and NS23 in a plane PL2 share a string selection line SSL2, and NAND strings NS31, NS32, and NS33 in a plane PL3 share a string selection line SSL3. The string selection lines SSL1, SSL2 and SSL3 are controlled independently, so that NAND strings NS11, NS12 and NS13 in any plane/row (e.g., PL1) are electrically connected with bit lines BL1, BL2 and BL3, respectively. NAND strings NS21, NS22, NS23, NS31, NS32, and NS33 in the remaining planes/rows (e.g., PL2 and PL3) are electrically separated from the bit lines BL1, BL2 and BL3, respectively.

In an exemplary embodiment, at programming and reading, one of the string selection lines SSL1 to SSL3 is selected by a row decoder circuit 200 in FIG. 1. That is, program and read operations are performed by a row or plane unit of NAND strings NS11 to NS13, NS21 to NS23, and NS31 to NS33. One page, for example, is selected by one string selection line, and is formed of memory cells (connected with one word line) in one plane. However, it is well understood that one page is not limited to such a configuration.

Figure 18A:
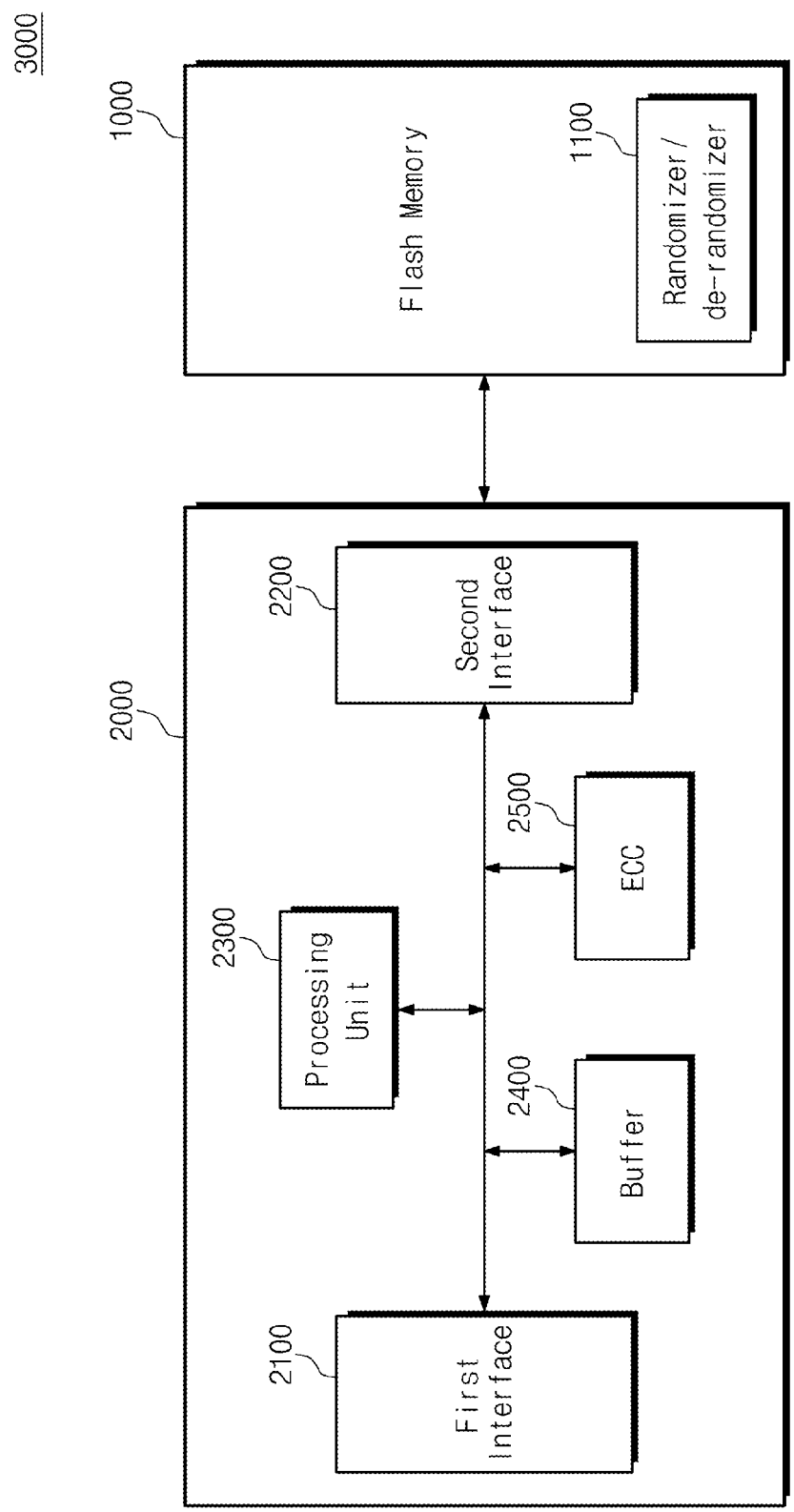
FIG. 18A is a block diagram showing a memory system according to an exemplary embodiment of the inventive concept.

FIG. 18A is a block diagram showing a memory system according to an exemplary embodiment of the inventive concept.

Referring to FIG. 18A, a memory system 3000 includes at least one flash memory 1000 and a controller 2000. The flash memory 1000 operates under the control of the controller 2000 and is used as a storage media. The controller 2000 may be configured to control the flash memory 1000. The flash memory 1000 may include a randomizing and de-randomizing circuit 1100. The flash memory 1000 in FIG. 18A is substantially the same as that illustrated in the examples of FIG. 1, 10 or 11, and a description thereof is thus omitted. The randomizing and de-randomizing circuit 1100 is configured to apply the same seed to each of access requested segments as described above.

The controller 2000 may include the first interface 2100, the second interface 2200, a processing unit 2300, a buffer memory 2400, and an ECC block 2500. The first interface 2100 is configured to interface with an external device (for example, a host), and the second interface 2200 is configured to interface with the flash memory 2200. The processing unit 2300 is configured to control an overall operation of the controller 2000. The buffer memory 2400 is configured to store data to be stored in the flash memory 1000 or data read out from the flash memory 1000. The ECC block 2500 generates ECC data based upon data from the buffer memory 2400. The ECC block 2600 performs error detecting and correcting operations with respect to data read from the flash memory 1000. The ECC data may be stored in the same page as data to be stored in the flash memory 1000 or in a region different from data to be stored in the flash memory 1000.

The controller 2000, as described in FIG. 5B, sets a segment size SEG_L using a set feature command after power-up. Setting of randomization on/off function and randomization off region is made by the controller 2000 together with setting of the segment size SEG_L. Further, as non-volatile trim information, a value of the segment size SEG_L can be stored in a memory cell array 100 of a flash memory device. In this case, at power-up, a value of the segment size SEG_L is loaded onto a randomizing and de-randomizing circuit 600 under the control of control logic 300 of a non-volatile memory device. As another example, as will be described later, a value of the segment SEG_L is set via a fuse option at a wafer or package level of fabrication.

In an exemplary embodiment, the first interface 2100 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, HyperTransport, etc. The storage bus standards may include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. The iFCP-Peripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, and so on.

Figure 18B:
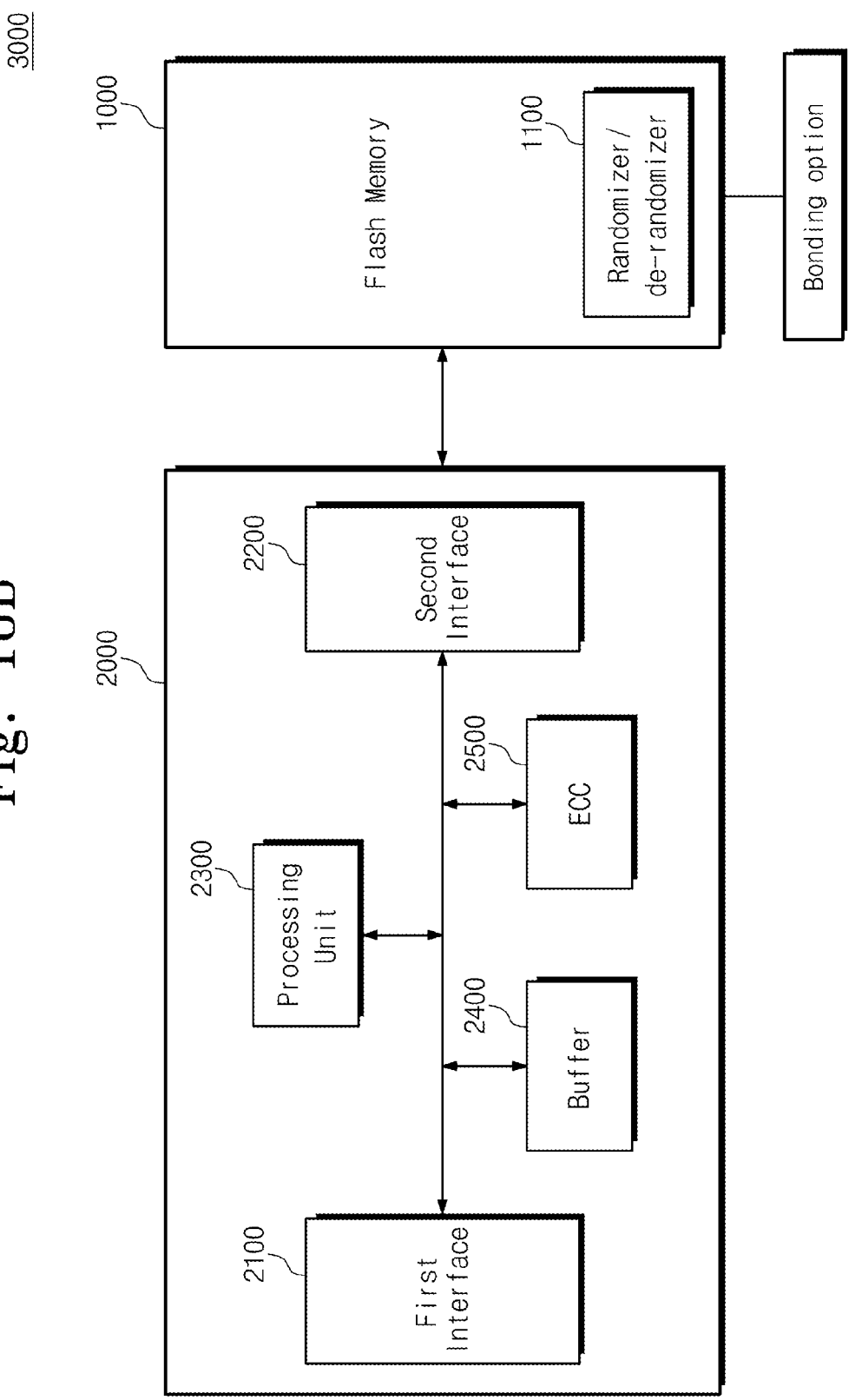
FIG. 18B is a block diagram showing a memory system according to another exemplary embodiment of the inventive concept.

FIG. 18B is a block diagram showing a memory system according to another exemplary embodiment of the inventive concept.

Referring to FIG. 18B, a memory system 3000' includes at least one flash memory 1000, a controller 2000, and a bonding option 3010. The flash memory 1000 and the controller 2000 in FIG. 18B are substantially the same as those in FIG. 18A except for the differences described next, and a description thereof is thus omitted.

The bonding option 3010 is used to provide a value of a segment size SEG_L to the non-volatile memory device 1000. The bonding option 3010, for example, is configured to set a value (e.g., a binary code value) of a specific segment size SEG_L, and includes fuses connected with pads. Setting of the specific segment size SEG_L is made at a package level. This case constitutes an alternative to the operation of transferring a set feature command to the flash memory 1000 from the controller 2000 after power-up to set the segment size SEG_L.

Figure 19:
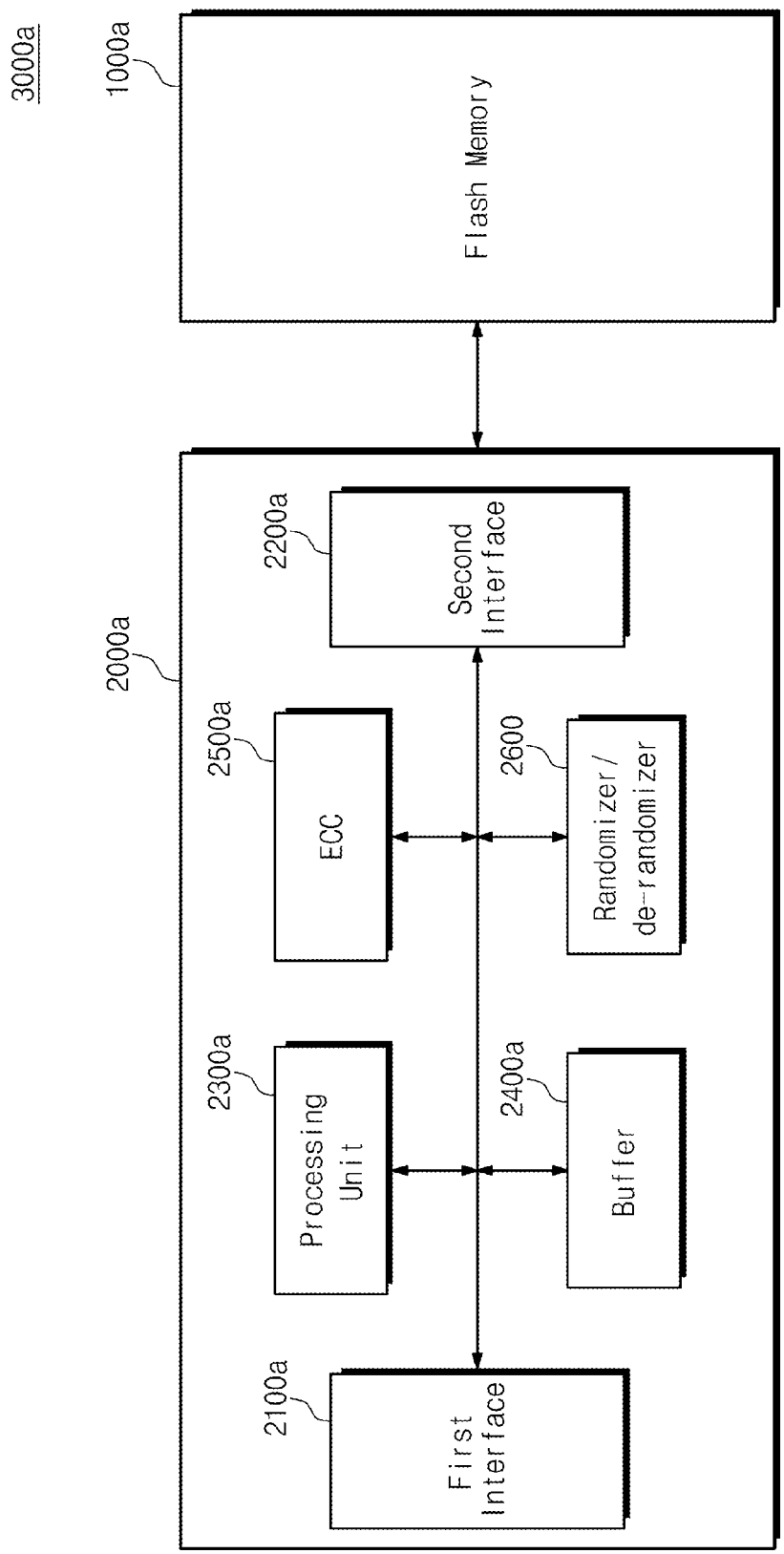
FIG. 19 is a block diagram showing a memory system according to another exemplary embodiment of the inventive concept.

FIG. 19 is a block diagram showing a memory system according to another exemplary embodiment of the inventive concept.

Referring to FIG. 19, a memory system 3000a includes at least one flash memory 1000a and a controller 2000a. The flash memory 1000a operates under the control of the controller 2000a, and is used as a storage media. The flash memory 1000a illustrated in FIG. 19 does not include the above-described randomizing and de-randomizing circuit. The controller 2000a is configured to control the flash memory 1000a. The controller 2000a is configured to randomize data to be stored in the flash memory 1000a and to add ECC data to the randomized data. The controller 2000a is configured to perform detecting and correcting operations with respect to errors of randomized data read out from the flash memory 1000a and to de-randomize randomized data.

The controller 2000a includes the first interface 2100a, the second interface 2200a, a processing unit 2300a, a buffer memory 2400a, an ECC block 2500a, and a randomizing and de-randomizing block 2600. The constituent elements 2100a, 2200a, ... 2300a, 2400a, and 2500a illustrated in FIG. 19 are substantially the same as those in FIG. 18A, and a description thereof is thus omitted.

The randomizing and de-randomizing block 2600 is configured to randomize data from the buffer memory 2400a and to de-randomize data (that is, randomized data) read out from the flash memory 1000a. The randomizing and de-randomizing block 2600 may perform randomizing and de-randomizing operations with respect to sequential data and random data according to any one of techniques described in FIGS. 1 to 12, and a description thereof is thus omitted. The ECC block 2500a generates ECC data based upon randomized data from the randomizing and de-randomizing block 2600. The ECC block 2500a performs error detecting and correcting operations on data read from the flash memory 1000a, that is, randomized data, based upon ECC data. The ECC data is stored in the same page as data to be stored in the flash memory 1000a or in a region different from data to be stored in the flash memory 1000a.

In case of a memory system in FIG. 19, a write operation includes randomizing data to be stored in the flash memory 1000a, generating ECC data based on the randomized data, and storing the randomized data and the ECC data in the flash memory 1000. Alternatively, a write operation may include randomizing both data to be stored and ECC data and storing the randomized result. A read operation includes performing error detecting and correcting operations with respect to read data (that is, randomized data) based on ECC data and randomizing the read data.

Figure 20:
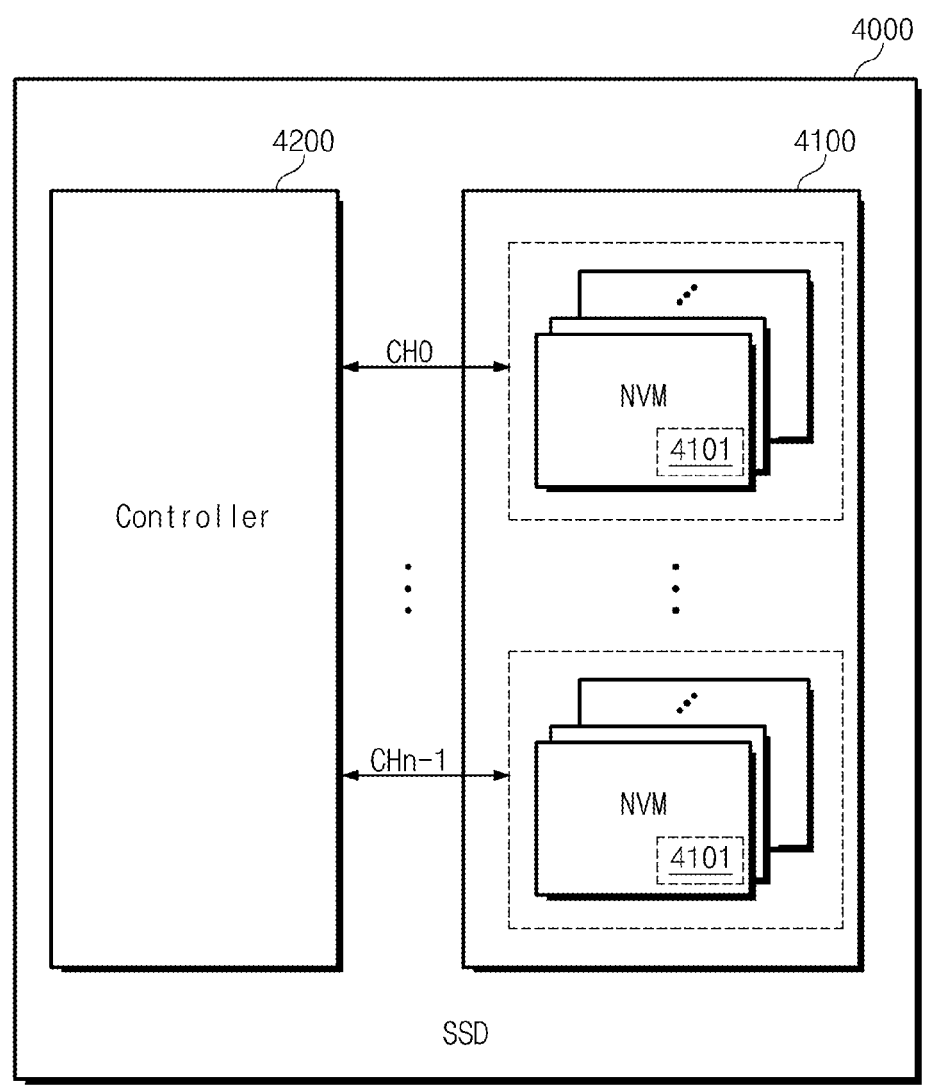
FIG. 20 is a block diagram showing a solid state drive according to an exemplary embodiment of the inventive concept.

FIG. 20 is a block diagram showing a solid state drive according to an exemplary embodiment of the inventive concept.

Referring to FIG. 20, a solid state drive (SSD) 4000 comprises a storage media 4100 and a controller 4200. The storage media 4100 is connected with the controller 4200 via a plurality of channels CH0 to CHn−1, each of which is connected in common with a plurality of non-volatile memories NVM. Each non-volatile memory NVM is formed of a flash memory described in the examples of FIG. 1, 10 or 11. That is, each non-volatile memory NVM includes a randomizing and de-randomizing circuit 4101. In this case, the controller 4200 is configured to be substantially the same as that in FIG. 18A. That is, data randomizing and de-randomizing may be made within each non-volatile memory, and error detecting and correcting may be made within the controller 4200.

Non-volatile memory devices connected with one channel (e.g., CH0) are used to store single-bit data (e.g., meta data, parity data, or the like), and non-volatile memory devices connected with each of the remaining channels (e.g., CH1 to CHn−1) are used to stored multi-bit data. In this case, the controller 4200 makes a randomization function of non-volatile memory devices of the channel CH0 become off using a set feature command. Likewise, the controller 4200 sets a randomization off region on non-volatile memory devices of the remaining channels CH0 using the set feature command.

Figure 21:
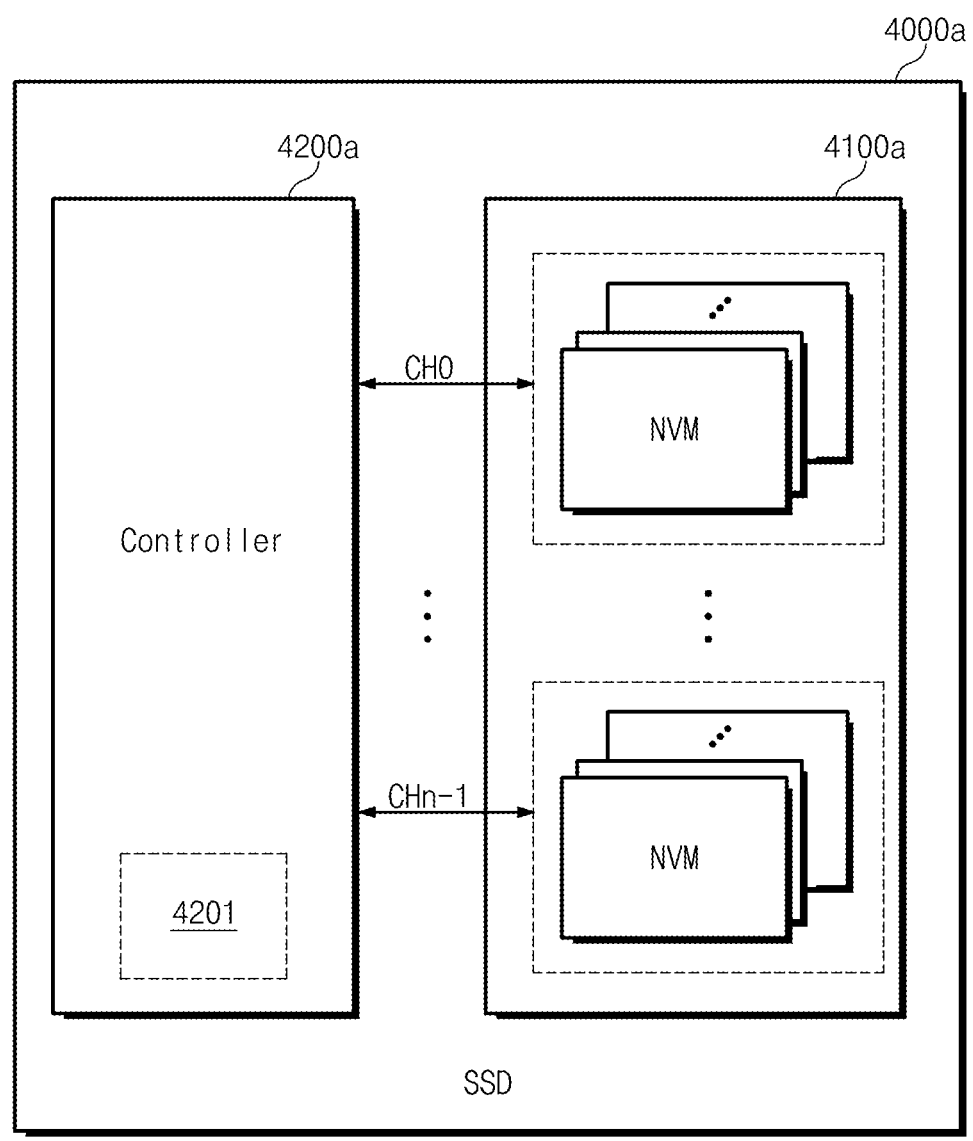
FIG. 21 is a block diagram showing a solid state drive according to another exemplary embodiment of the inventive concept.

FIG. 21 is a block diagram showing a solid state drive according to another exemplary embodiment of the inventive concept.

Referring to FIG. 21, a solid state drive (SSD) 4000a comprises a storage media 4100a and a controller 4200a. The storage media 4100a is connected with the controller 4200a via a plurality of channels CH0 to CHn−1, each of which is connected in common with a plurality of non-volatile memories NVM. Each non-volatile memory NVM does not include a randomizing and de-randomizing circuit. In this case, each non-volatile memory device is configured to be substantially the same as that in FIG. 19. The controller 4200a includes a randomizing and de-randomizing circuit 4102.

Each non-volatile memory NVM is formed of a flash memory in the examples described in FIG. 1, 10 or 11. In addition, each non-volatile memory NVM may include a randomizing and de-randomizing circuit 4101. In this case, the controller 4200 is configured to be substantially the same as that in FIG. 18A. That is, data randomizing and de-randomizing may be made within each non-volatile memory, and error detecting and correcting may be made within the controller 4200. In this case, the controller 4200a is configured to be substantially the same as that in FIG. 19. That is, not only data randomization and de-randomization, but also error detection and correction, may be made within the controller 4200a.

Figure 22:
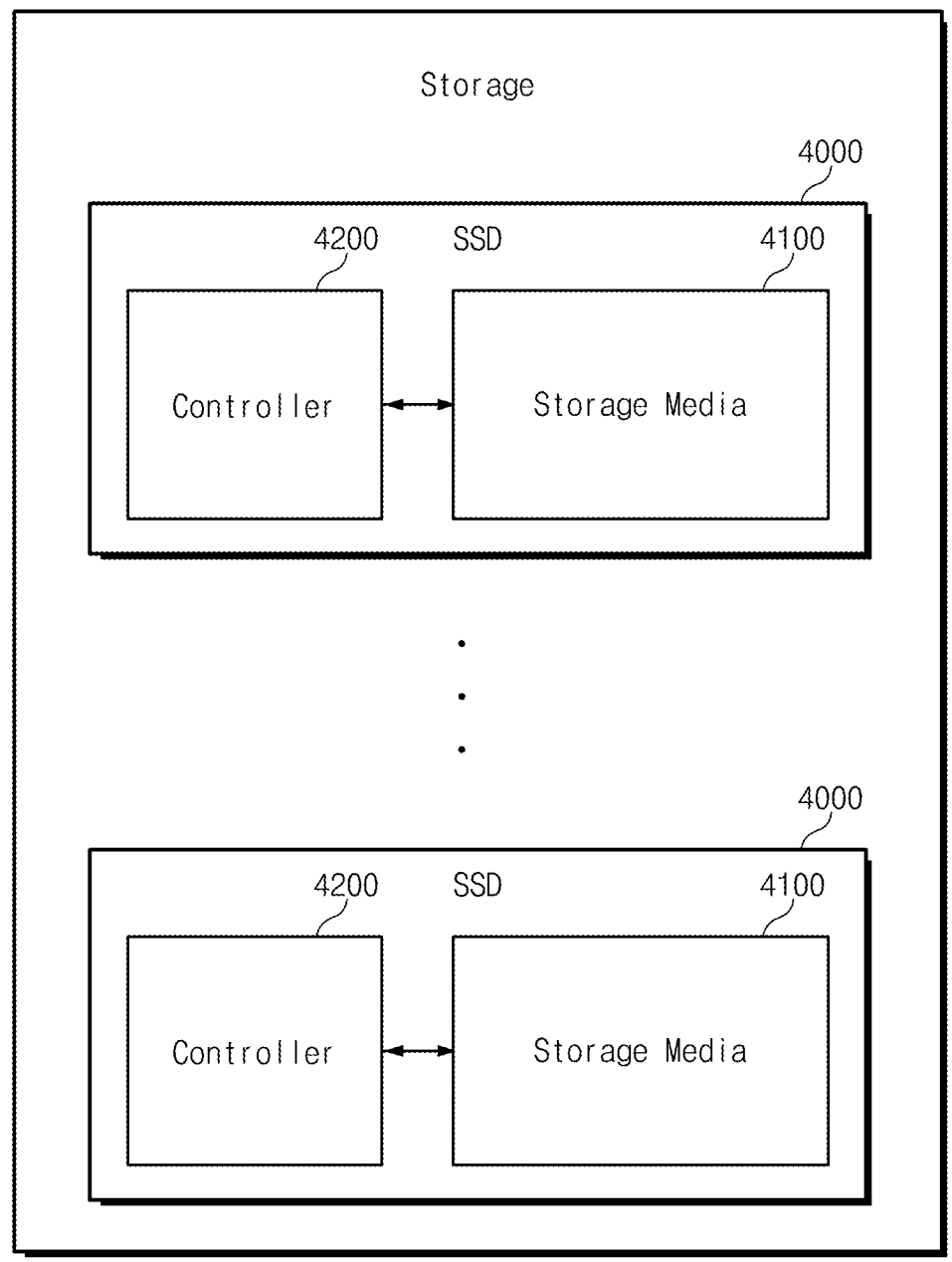
FIG. 22 is a block diagram showing storage using a solid state drive illustrated in FIG. 20 or 21.
Figure 23:
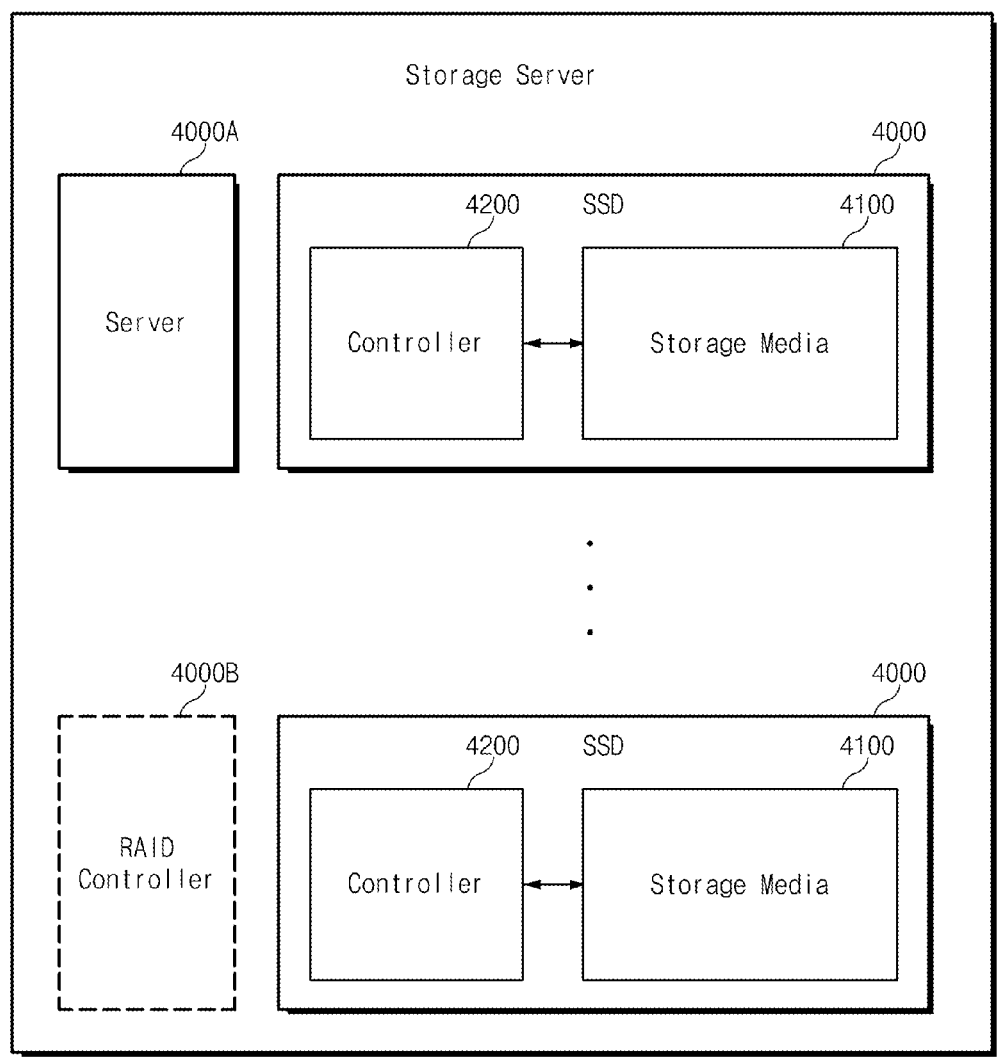
FIG. 23 is a block diagram showing a storage server using a solid state drive illustrated in FIG. 20 or 21.

FIG. 22 is a block diagram showing storage using a solid state drive illustrated in FIG. 20 or 21, and FIG. 23 is a block diagram showing a storage server using a solid state drive illustrated in FIG. 20 or 21.

An SSD 4000 according to an exemplary embodiment of the inventive concept is used to configure storage. As illustrated in FIG. 22, storage includes a plurality of solid state drives 4000 each of which is configured to be substantially the same as that described in FIG. 20 or 21. The SSD 4000 according to an exemplary embodiment of the inventive concept is used to configure a storage sever. As illustrated in FIG. 23, a storage server includes a plurality of solid state drives 4000, each of which is configured to be substantially the same as that described in FIG. 20 or 21, and a server 4000A for controlling an overall operation of the storage server. Further, it is well comprehended that the storage server further includes a RAID controller 4000B for parity management according to a parity manner applied to repair defects on data stored in the solid state drives 4000.

Figure 24:
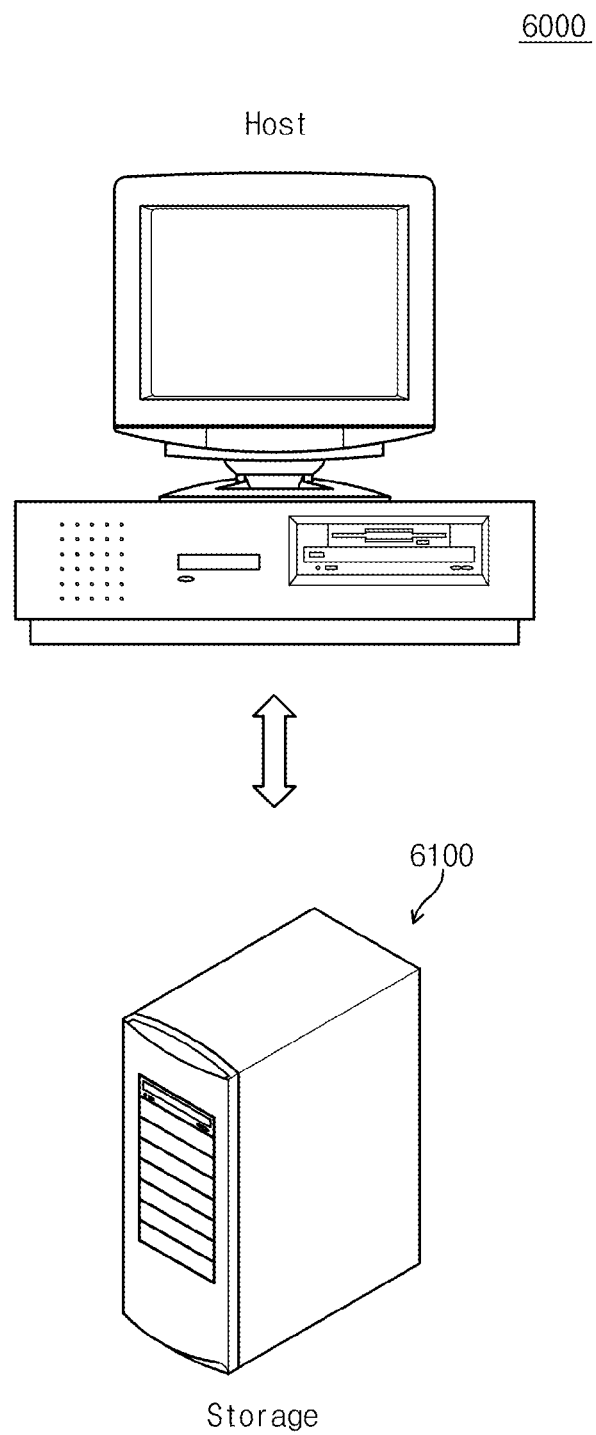
FIGS. 24 to 26 are diagrams showing systems according to exemplary embodiments of the inventive concept.
Figure 25:
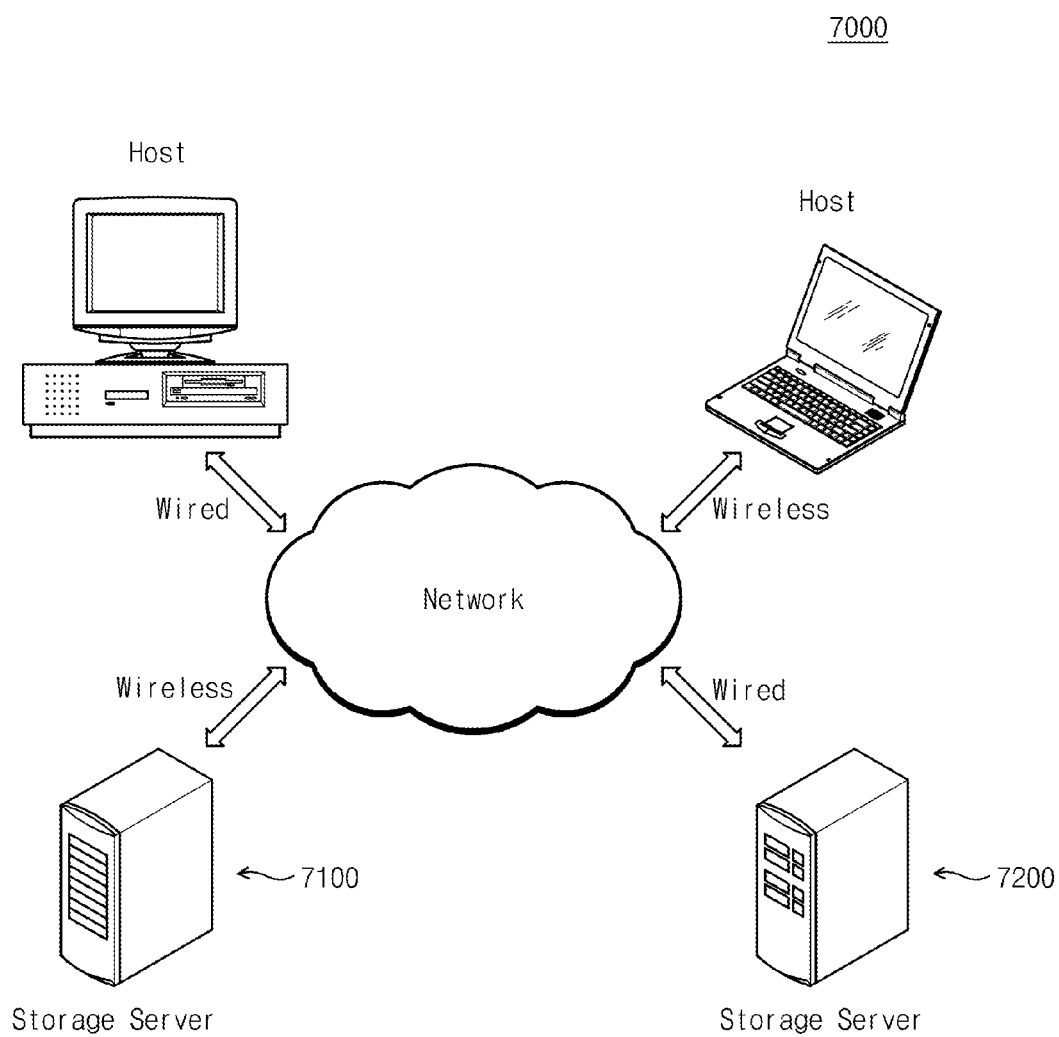
Figure 26:
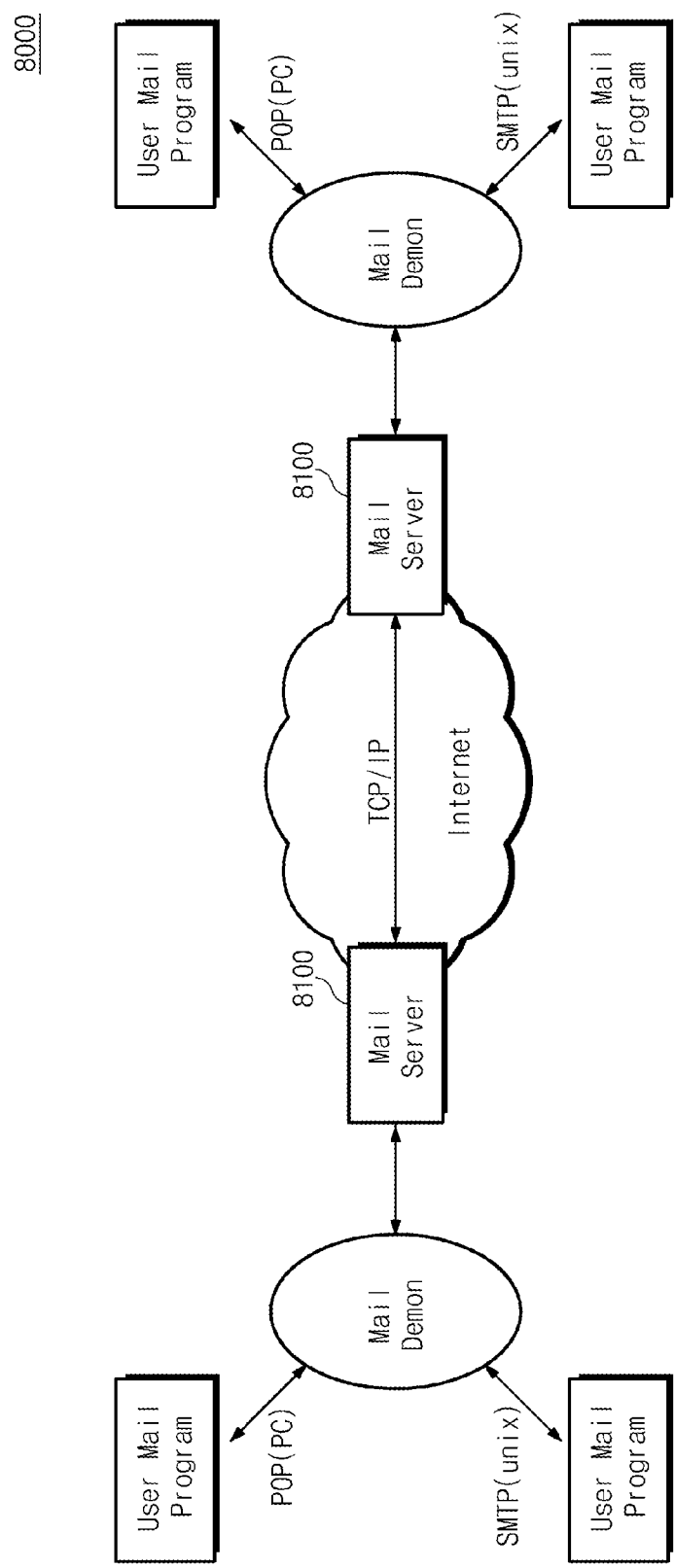

FIGS. 24 to 26 are diagrams showing systems according to exemplary embodiments of the inventive concept.

In the event that a solid state drive including a memory controller and flash memory devices according to exemplary embodiments of the inventive concept is applied to storage, as illustrated in FIG. 24, a system 600 includes a storage 6100 which communicates with a host by a wire or wireless manner. In a case where a solid state drive including a data storage device according to exemplary embodiments of the inventive concept is applied to a storage server, as illustrated in FIG. 25, a system 7000 includes storage servers 7100 and 7200 which communicate with a host by a wire or wireless manner. Further, as illustrated in FIG. 26, a solid state drive including a data storage device according to exemplary embodiments of the inventive concept can be applied to a mail server 8100. The mail server 8100 may communicate with mail programs via a mail demon connected in POP and SMTP techniques, and the mail servers 8100 may communicate through an internet network.

FIGS. 27 to 31 are diagrams showing other systems to which a non-volatile memory device according to an exemplary embodiment of the inventive concept is applied.

Figure 27:
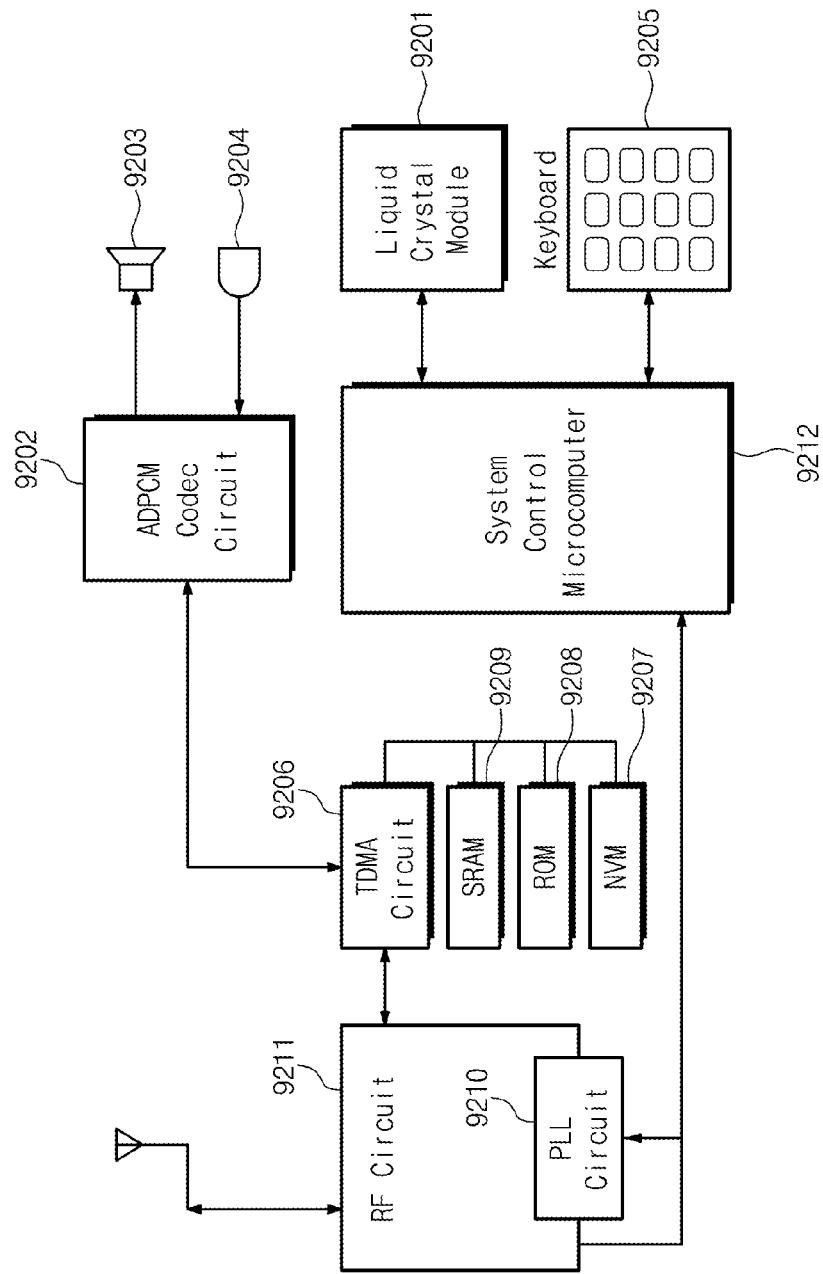
FIGS. 27 to 31 are diagrams showing other systems to which a non-volatile memory device according to an exemplary embodiment of the inventive concept is applied.

FIG. 27 is a block diagram illustrating a cellular phone system to which a flash memory device according to an exemplary embodiment of the inventive concept is applied. Referring to FIG. 27, a cellular phone system may include an ADPCM codec circuit 9202 for compressing a voice and decompressing a compressed voice, a speaker 9203, a microphone 9204, a TDMA circuit 9206 for time-division multiplexing digital data, a PLL circuit 9210 configured to set a carrier frequency of a radio frequency signal, an RF circuit 9211 configured to send and receive a radio frequency signal, and the like.

Further, the cellular phone system may include various types of memories, such as the flash memory device 9207 as a non-volatile memory device, the ROM 9208, and the SRAM 9209. As a memory device 9207 of the cellular phone system, flash memory device described in FIG. 1 is used. That is, the memory device 9207 is configured to apply the same seed to access-requested segments, respectively. The ROM 9208 is used to store programs, and the SRAM 9209 is used as a work region for the system control microcomputer 9212 or/and to temporarily store data. Herein, the system control microcomputer 9212 is a processor which is configured to control write and read operations of the flash memory device 9207.

Figure 28:
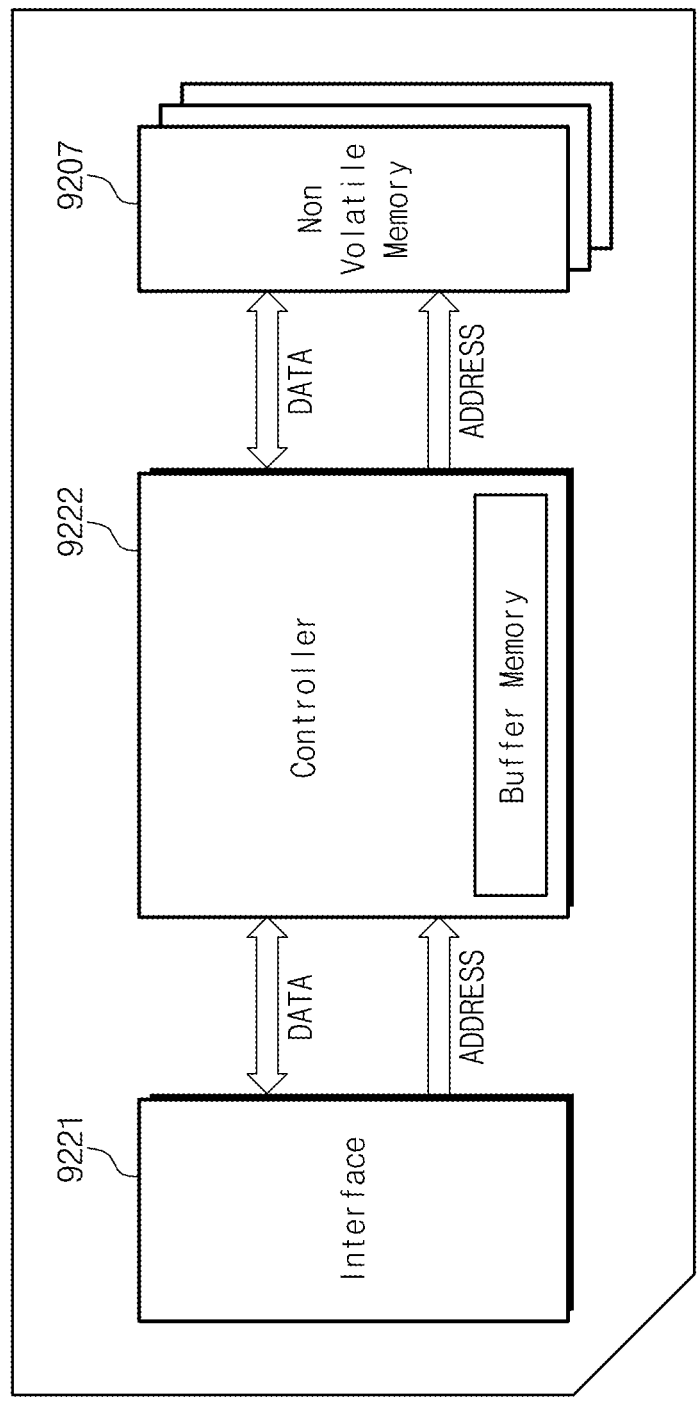

FIG. 28 is a block diagram illustrating a memory card to which a flash memory device according to an exemplary embodiment of the inventive concept is applied. A memory card, for example, may be an MMC card, an SD card, a multiuse card, a micro-SD card, a memory stick, a compact SD card, an ID card, a PCMCIA card, an SSD card, a chip-card, a smartcard, an USB card, an MCP-type embedded card storage, or the like. The MCP-type embedded card storage may include an eMMC (embedded MMC), an Esd (embedded SD), an eSSD (embedded SSD), a PPN (Perfect Page NAND), and the like.

Referring to FIG. 28, the memory card may include an interface circuit 9221 for interfacing with an external device, a controller 9222 including a buffer memory and controlling an operation of the memory card, and at least one flash memory device 9207 according to an exemplary embodiment of the inventive concept. The flash memory device 9207 is configured to apply the same seed to access-requested segments, respectively. The controller 9222 is a processor which is configured to control write and read operations of the flash memory device 9207. In particular, the controller 9222 is coupled with the non-volatile memory device 9207 and the interface circuit 9221 via a data bus DATA and an address bus ADDRESS.

Figure 29:
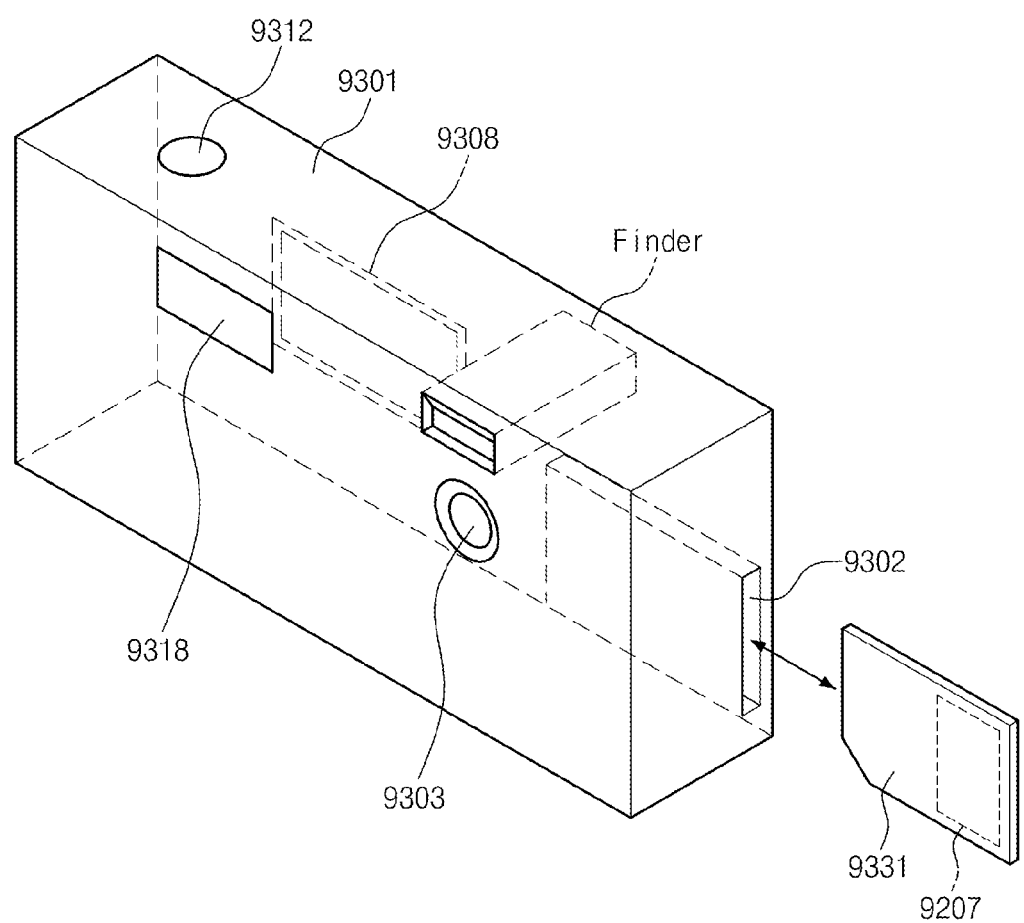

FIG. 29 is a block diagram illustrating a digital still camera to which a flash memory device according to an exemplary embodiment of the inventive concept is applied.

Referring to FIG. 29, a digital still camera may include a body 9301, a slot 9302, a lens 9303, a display circuit 9308, a shutter button 9312, a strobe 9318, and the like. In particular, a memory card 9331 is inserted in the slot 9308 and includes at least one flash memory device 9207 according to an exemplary embodiment of the inventive concept configured to apply the same seed to access-requested segments, respectively. If the memory card 9331 has a contact type, an electric circuit on a circuit board may be electrically contacted with the memory card 9331 when it is inserted in the slot 9308. In the event that the memory card 931 has a non-contact type, an electric circuit on a circuit board may communicate with the memory card 9331 in a radio-frequency manner.

Figure 30:
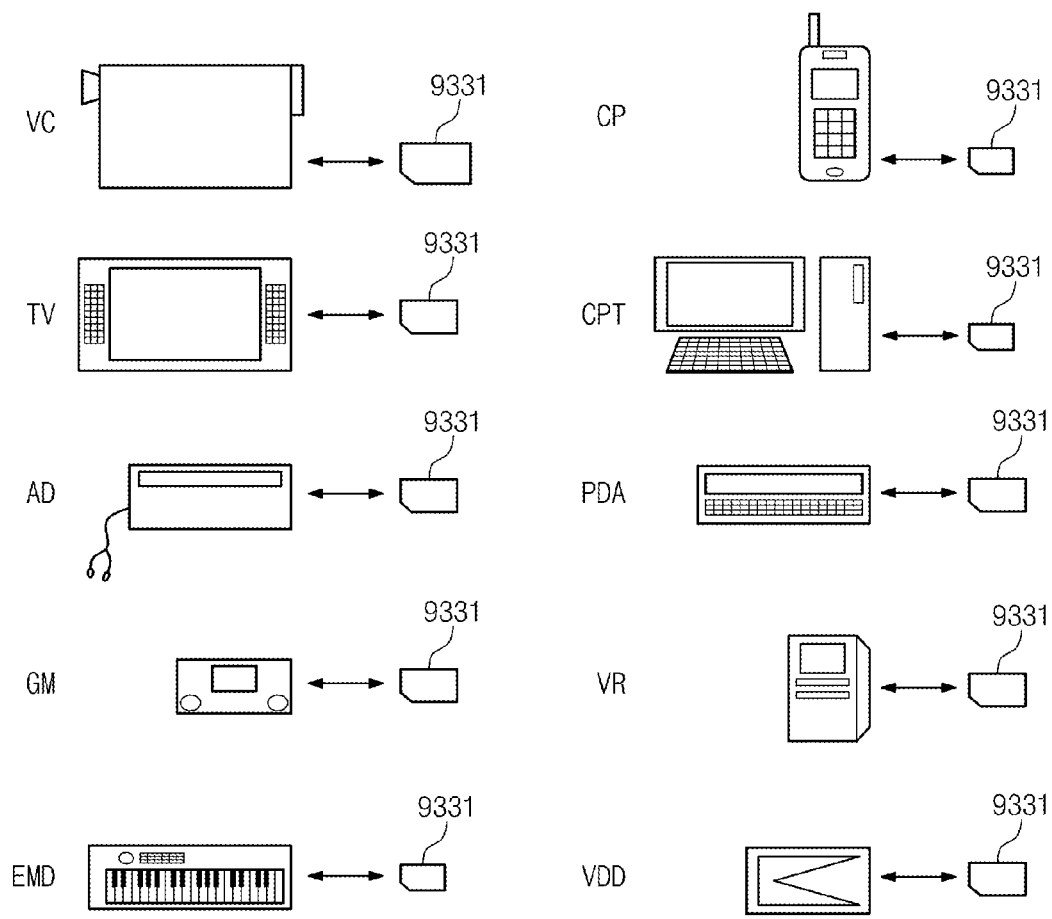

FIG. 30 is a diagram illustrating various systems to which a memory card in FIG. 29 is applied.

Referring to FIG. 30, a memory card 9331 may be applied to a video camera VC, a television TV, an audio device AD, a game machine GM, an electronic music device EMD, a cellular phone CP, a computer CMP, a Personal Digital Assistant PDA, a voice recorder VR, a PC card PCC, and the like.

Figure 31:
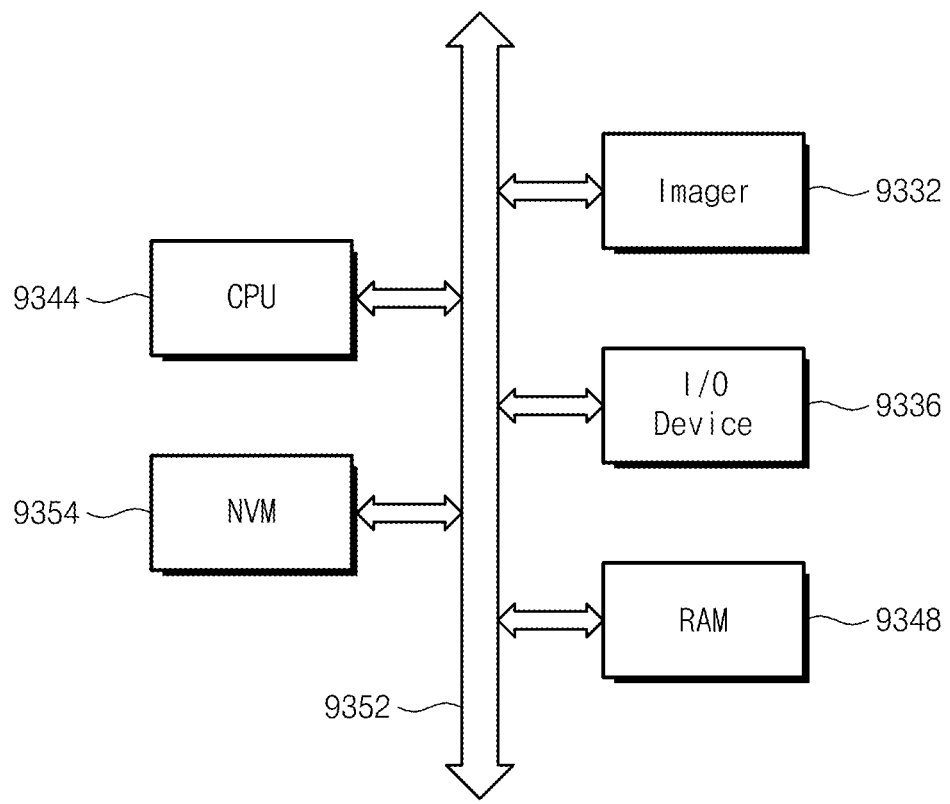

FIG. 31 is a block diagram illustrating an image sensor system to which a flash memory device according to an exemplary embodiment of the inventive concept is applied.

Referring to FIG. 31, an image sensor system may include an image sensor 9332, an input/output device 9336, RAM 9348, CPU 9344, and a flash memory device 9354 according to an exemplary embodiment of the inventive concept. The flash memory device 9354 is configured to generate an initial seed for random data as described herein. Elements, that is, the image sensor 9332, the input/output device 9336, the RAM 9348, the CPU 9344, and the flash memory device 9354 may communicate with one another via a bus 9352. The image sensor 9332 may include a photo sensing device such as a photo-gate, photo-diode, or the like. Each element may be formed of a single chip together with a processor or independently from the processor.

In an exemplary embodiment of the inventive concept, memory cells can be formed of a variable resistance memory cell. An exemplary variable resistance memory cell and a memory device including the same are disclosed in U.S. Pat. No. 7,529,124, the entirety of which is incorporated by reference herein.

In another exemplary embodiment of the inventive concept, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, and so on.

A memory device having a charge trap flash structure as a charge storage layer is disclosed in U.S. Pat. No. 6,858,906 and U.S. Publication Nos. 2004/0169238 and 2006/0180851, the entireties of which are incorporated by reference herein. A source-drain free flash structure is disclosed in KR Patent No. 673020, the entirety of which is incorporated by reference herein.

A flash memory device and/or a memory controller according to the inventive concept may be physically implemented as any of various different types of device packages. For example, a flash memory device and/or a memory controller according to the inventive concept may be packaged such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A nonvolatile memory device comprising:
a page buffer circuit configured to read or write data from or to a selected page of a memory cell array; and
a randomization and de-randomization circuit configured to randomize and de-randomize data being transferred to or from the page buffer circuit based on a seed assigned to the selected page,
wherein the selected page includes a plurality of segments;
wherein the randomization and de-randomization circuit is further configured to generate a random sequence for each of access-requested segments among the plurality of segments of the selected page based on the seed assigned to the selected page and to randomize and de-randomize data of each access-requested segment based on the random sequence which is iteratively generated according to the seed, and
wherein the randomization and de-randomization circuit comprises:
a seed table configured to store seeds corresponding to the pages, respectively;
a pseudo-random sequence generator configured to generate a random sequence based on a seed provided from the seed table and corresponding to the selected page;
a mixer configured to logically combine the random sequence and data of an access-requested segment; and
a seed initialization part configured to initialize the pseudo-random sequence generator with the seed corresponding to the selected page so as to randomize and de-randomize data of each of access-requested segments according to the random sequence which is iteratively generated according to the seed corresponding to the selected page.

2. The nonvolatile memory device of claim 1, wherein the seed initialization part performs a seed initialization operation for initializing the pseudo-random sequence generator with a seed,
wherein a seed initialization operation on data of a first one of the access-requested segments is performed upon access request, and
wherein a seed initialization operation on data of the remaining access-requested segments is performed when last segment data of a current access-requested segment is processed.

3. The nonvolatile memory device of claim 2, wherein the seed initialization part comprises:
a register;
a first adder configured to add a value of an address of data being transferred and a value (SEG-1) smaller by 1 than a segment size;
a second adder configured to add an output value of the register and the segment size;
a selector configured to select one of output values of the first and second adders in response to a selection signal being activated upon completion of access request, an output value selected by the selector being transferred to the register;
a comparator configured to judge whether an output value of the register is the same as a value of the address of the data being transferred and to generate a pulse signal as a comparison result; and
a logic gate configured to generate an initialization signal in response to the selection signal and the pulse signal,
wherein the register stores an output value selected by the selector in response to the initialization signal and the pseudo-random sequence generator is initialized by the seed corresponding to the selected page in response to the initialization signal.

4. The nonvolatile memory device of claim 3, wherein a value indicating the segment size is provided from an external device with a set feature command.

5. The nonvolatile memory device of claim 1, further comprising:
control logic configured to store randomization on/off information and random off region information input according a specific command and to generate a randomization off flag signal based on the random off region information upon access request.

6. The nonvolatile memory device of claim 5, wherein an off region defined by the random off region information is determined by a unit of data smaller in size than a segment, a segment, a page, a block, a plane, or a chip.

7. The nonvolatile memory device of claim 5, wherein the randomization and de-randomization circuit further comprises:
a multiplexer configured to select one of an output of the mixer and data of the access-requested segment in response to a randomization off flag signal.

8. The nonvolatile memory device of claim 7, wherein the multiplexer transfers data of an access-requested segment to the mixer or to an input/output interface part.

9. A memory card comprising:
a nonvolatile memory device including a plurality of pages; and
a controller including a buffer and configured to control the nonvolatile memory device,
wherein the controller further includes a randomization and de-randomization circuit configured to randomize and de-randomize data being transferred to and from the nonvolatile memory device based on a seed assigned to a selected page, the selected page including a plurality of segments; and
wherein the randomization and de-randomization circuit comprises:
a seed table configured to store seeds corresponding to the pages, respectively;
a pseudo-random sequence generator configured to generate a random sequence based on a seed provided from the seed table and corresponding to the selected page;
a mixer configured to logically combine the random sequence and data of an access-requested segment among the segments of the selected page; and
a seed initialization part configured to initialize the pseudo-random sequence generator with the seed corresponding to the selected page so as to randomize and de-randomize data of each of access-requested segments among the segments of the selected page according to the random sequence iteratively generated according to the seed corresponding to the selected page.

10. The memory card of claim 9, wherein the seed initialization part performs a seed initialization operation for initializing the pseudo-random sequence generator with a seed, wherein a seed initialization operation on data of a first one of the access-requested segments is performed upon access request, and wherein a seed initialization operation on data of the remaining access-requested segments is performed when last segment data of a current access-requested segment is processed.

\* \* \* \* \*